(12) United States Patent
Mizuno et al.

(10) Patent No.: US 7,808,030 B2
(45) Date of Patent: Oct. 5, 2010

(54) ELECTRONIC COMPONENT MANUFACTURING METHOD AND ELECTRONIC COMPONENT

(75) Inventors: Yoshihiro Mizuno, Kawasaki (JP); Xiaoyu Mi, Kawasaki (JP); Tsuyoshi Matsumoto, Kawasaki (JP); Hisao Okuda, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 67 days.

(21) Appl. No.: 11/595,913

(22) Filed: Nov. 13, 2006

(65) Prior Publication Data

US 2007/0122992 A1    May 31, 2007

(30) Foreign Application Priority Data

Nov. 25, 2005   (JP) .............................. 2005-340121

(51) Int. Cl.
*H01L 21/76* (2006.01)
(52) U.S. Cl. ................................ 257/303; 257/E27.116
(58) Field of Classification Search .................. 257/303, 257/E27.116
See application file for complete search history.

(56) References Cited

U.S. PATENT DOCUMENTS

| | | | |
|---|---|---|---|
| 6,262,446 B1 | 7/2001 | Koo et al. | |
| 6,740,974 B2 | 5/2004 | Yoshitomi | |
| 6,800,920 B2 * | 10/2004 | Nishijima | 257/531 |
| 6,956,261 B2 * | 10/2005 | Shibata | 257/306 |
| 7,042,041 B2 | 5/2006 | Nakashima | |
| 2003/0201484 A1 | 10/2003 | Ozawa | 257/306 |
| 2003/0219956 A1 | 11/2003 | Mori et al. | 438/393 |
| 2004/0080021 A1 | 4/2004 | Casper et al. | 257/528 |

FOREIGN PATENT DOCUMENTS

| | | |
|---|---|---|
| JP | 4-61264 | 2/1992 |
| JP | 2000-58771 | 2/2000 |
| JP | 2002-33239 | 1/2002 |
| JP | 2003-7834 | 1/2003 |
| JP | 2004-273920 | 9/2004 |

OTHER PUBLICATIONS

European Search Report dated Feb. 5, 2007.

* cited by examiner

*Primary Examiner*—Evan Pert
*Assistant Examiner*—Krista Soderholm
(74) *Attorney, Agent, or Firm*—Fujitsu Patent Center

(57) ABSTRACT

The electronic component includes a base material, a capacitor unit, and a wiring portion. The capacitor unit has a stacked structure including a first electrode portion provided on the base material, a second electrode portion including a first surface opposing the first electrode portion and a second surface opposite to the first surface, and a dielectric portion interposed between the electrode portions. The wiring portion includes a via portion having a surface on the base material side, and joined to the second surface of the second electrode portion via the surface on the base material side. The surface of the via portion on the base material side includes an extending portion extending outward of the periphery of the second surface of the second electrode portion.

8 Claims, 19 Drawing Sheets

ELECTRONIC COMPONENT MANUFACTURING METHOD AND ELECTRONIC COMPONENT

BACKGROUND OF THE INVENTION

1. Field of the Invention

The present invention relates to a technique concerning an electronic component that includes a capacitor and an inductor as constituents.

2. Description of the Related Art

In a radio frequency (hereinafter, RF) system such as a mobile phone or a wireless LAN, signals have to be subjected to phase-matching for satisfactory transmission among functional devices constituting the system. Accordingly, the input/output terminal of each device is generally provided with a passive element that includes a passive component such as an inductor or a capacitor, and that acts as a phase shifter that controls the phase of the signals.

There has been a constant demand for reduction in dimensions of various parts composing the RF system, driven by the increase in number of parts for achieving a higher performance. For making the system smaller in dimensions, an integrated electronic component manufactured based on a semiconductor processing technology, which includes a plurality of predetermined passive components such as an inductor, a capacitor, a resistance and a filter densely integrated on a substrate, may be employed as the passive element (phase shifter). Techniques related to the integrated electronic component are found, for example, in JP-A-H04-61264 and JP-A-2002-33239.

FIG. 21 is a fragmentary cross-sectional view showing an integrated electronic component X3 as related art for better understanding of the present invention. It should be noted that the integrated electronic component X3 was produced by the present inventors, and is not publicly known as of the priority date of the present application.

The integrated electronic component X3 includes a substrate 91, a capacitor 92, a spiral coil 93 (FIG. 21 shows a cross-section of a part of the lead wire thereof), an electrode pad 94, a wiring 95, and a protecting film 96. The capacitor 92 has a stacked structure including electrode films 92a, 92b and a dielectric film 92c. The spiral coil 93 is an inductor patterned in a flat spiral shape on the substrate 91, and includes an inner end portion 93a located at an innermost position of the spiral shape. The electrode pad 94 serves for external connection. The wiring 95 includes a first wiring portion 95a patterned on the substrate 91, a second wiring portion 95b patterned mainly on the protecting film 96, and a via 95c. The electrode film 92a of the capacitor 92 and the electrode pad 94 are electrically connected directly. A via 95c of the wiring 95 is connected to the electrode film 92b of the capacitor 92. Another via 95c of the wiring 95 is connected to the inner end portion 93a of the spiral coil 93. The protecting film 96 is disposed so as to cover the capacitor 92 and the spiral coil 93 on the substrate 91.

FIGS. 22A through 23D illustrate a manufacturing method of the integrated electronic component X3. To form the integrated electronic component X3, firstly the electrode film 92a of the capacitor 92 is patterned on the substrate 91, as shown in FIG. 21A. Referring to FIG. 21B, the dielectric film 92c is patterned on the electrode film 92a. An electroplating process is then performed to form the electrode film 92b of the capacitor 92, the spiral coil 93 (inner end portion 93a inclusive), and the first wiring portion 95a of the wiring 95, as shown in FIG. 21C. This is followed by formation of an insulating film 96' on the substrate 91, as shown in FIG. 21D.

Proceeding to FIG. 23A, a resist pattern 97 is formed on the insulating film 96'. The resist pattern 97 is formed with an opening 97a corresponding to the pattern of the via 95c of the wiring 95, and an opening 97b corresponding to the pattern of the electrode pad 94. Then a wet etching process is performed over the insulating film 96', utilizing the resist pattern 97 as the mask, as shown in FIG. 23B. At this stage, the protecting film 96 provided with an opening 96a for the via 95c and an opening 96b for the electrode pad 94 is formed. The resist pattern 97 is then removed, as shown in FIG. 23C. This is followed by an electroplating process for forming the via 95c, the second wiring portion 95b, and the electrode pad 94 as shown in FIG. 23D. That is how the integrated electronic component X3 is manufactured.

In the integrated electronic component X3, the protecting film 96 is required to have a sufficient thickness (that allows securing a gap of 10 µm or wider between the spiral coil 93 and the second wiring portion 95b) in order to prevent undue electromagnetic interaction between the spiral coil 93 serving as the inductor and the second wiring portion 95b located above the spiral coil 93. The thicker the protecting film 96 is, the more difficult it becomes to form the opening 96a having a small diameter R3' in the process described referring to FIG. 23B, and hence to form the via 95c of a small diameter R3. Accordingly, making the protecting film 96 thick causes enlarging the minimum diameter R3 (shown in FIGS. 21 and 23D) which is applicable to each via 95c. In other words, the dimension of the thickness of the protecting film 96 determines the lower limit of the applicable diameter R3 of each via 95c.

In the integrated electronic component X3, moreover, a length L5 of the electrode film 92b of the capacitor 92 shown in FIG. 21 cannot be made smaller than the diameter R3 of the via 95c connected to the electrode film 92b. Setting the length L5 of the electrode film 92b to be smaller than the diameter R3 of the via 95c would, in the process described referring to FIG. 23B, cause the opening 96b for the electrode pad 94 to reach as far as the electrode film 92a (the etching process has to be performed until the opening 96b for the electrode pad 94 reaches the electrode film 92a), and the opening 96a to reach the dielectric film 92c (or to even reach the electrode film 92a, depending on the size of the dielectric film 92c), as shown in FIG. 24A. Executing the process described referring to FIG. 23D with the opening 96a thus formed would, as shown in FIG. 24B, result in formation of the via 95c connected to the dielectric film 92c in addition to the electrode film 92b (or even to the electrode film 92a, depending on the size of the dielectric film 92c). Such via 95c would degrade the characteristic of the capacitor 92, and hence the characteristic of the integrated electronic component X3. Therefore, in the integrated electronic component X3, the electrode film 92b has to be formed with a sufficient length L5 (and a sufficient two-dimensional size) against the diameter R3 of the via 95c connected to the electrode film 92b.

In order to reduce the static capacitance of the capacitor 92, while satisfying the requirement for reduction in dimensions of the integrated electronic component X3, for example the length L5 has to be set to be smaller thus to reduce the two-dimensional size of the electrode film 92b. Actually, however, the minimum applicable diameter R3 is restrained depending on the thickness granted to the protecting film 96, and besides the electrode film 92b has to be formed with a sufficient length L5 (and a sufficient two-dimensional size) against the diameter R3 of the via 95c connected to the electrode film 92b, as already stated. These factors impede the attempt of reducing the static capacitance of the capacitor 92, while satisfying the requirement for reduction in dimensions of the integrated electronic component X3.

In the integrated electronic component X3, further, it is not desirable to set a length L6 of the inner end portion 93a of the spiral coil 93 shown in FIG. 21 to be smaller than the diameter R3 of the via 95c connected to the inner end portion 93a. Setting the length L6 of the inner end portion 93a to be smaller than the diameter R3 of the via 95c would, in the process described referring to FIG. 23B, cause the opening 96b to reach as far as the electrode film 92a (the etching process has to be performed until the opening 96b for the electrode pad 94 reaches the electrode film 92a), and the opening 96a to reach the substrate 91, as shown in FIG. 25A. Executing the process described referring to FIG. 23D with the opening 96a thus formed would, as shown in FIG. 25B, result in formation of the via 95c having such a large volume as reaching the substrate 91. Such via 95c may incur degradation in Q value of the spiral coil 93. Therefore, in the integrated electronic component X3, the inner end portion 93a has to be formed with a sufficient length L6 (and a sufficient two-dimensional size) against the diameter R3 of the via 95c connected to the inner end portion 93a.

In order to increase the Q value of the spiral coil 93, while satisfying the requirement for reduction in dimensions of the integrated electronic component X3, for example the length L6 has to be set to be smaller thus to reduce the two-dimensional size of the inner end portion 93a. Actually, however, the minimum applicable diameter R3 is restrained depending on the thickness granted to the protecting film 96, while it is desirable to form the inner end portion 93a with a sufficient length L6 (and a sufficient two-dimensional size) against the diameter R3 of the via 95c connected to the inner end portion 93a, as already stated. These factors impede the attempt of increasing the Q value of the spiral coil 93, while satisfying the requirement for reduction in dimensions of the integrated electronic component X3.

SUMMARY OF THE INVENTION

The present invention has been proposed under the foregoing situation, with an object to provide a method of manufacturing an electronic component appropriate for constituting an integrated electronic component, and the electronic component appropriate for constituting the integrated electronic component.

A first aspect of the present invention provides a method of manufacturing an electronic component. The method is for manufacturing an electronic component including: a base material; an electrode pad provided on the base material, the electrode pad having a stacked structure including a first portion having a first pad-surface on the side of the base material and a second pad-surface opposite to the first pad-surface and a second portion joined to the first portion; a capacitor unit having a stacked structure including a first electrode portion provided on the base material, a second electrode portion having a first electrode-surface facing the first electrode portion and a second electrode-surface opposite to the first electrode-surface, and a dielectric portion interposed between the first and the second electrode portion; and a wiring portion including a via portion having a wiring-surface facing the base material, the wiring-surface being joined to the second electrode-surface of the second electrode portion; wherein the wiring-surface of the via portion includes an extending portion extending outward of a periphery of the second electrode-surface of the capacitor unit. The method comprises: forming an insulating film on the base material so as to cover the first portion and the capacitor unit after forming at least the first portion of the electrode pad, and the first electrode portion, the dielectric portion and the second electrode portion of the capacitor unit on the base material; and providing the insulating film with a first opening for forming the second portion such that at least part of the second pad-surface of the first portion is exposed, and with a second opening for forming the via portion such that at least part of the second electrode-surface of the second electrode portion is exposed (opening formation step). The opening formation step may include performing an etching process (for example, wet etching process) over the insulating film, through a predetermined resist pattern provided thereon.

The opening formation step thus arranged allows stopping the etching process when at least a part of the second surface of the first portion, which is to constitute a part of the electrode pad, and at least a part of the second surface of the second electrode portion of the capacitor unit are properly exposed, thereby preventing the opening for the via portion from reaching the dielectric film and the first electrode portion. Accordingly, when performing for example an electroplating process to deposit a conductor material in the opening for the via portion after the opening formation step, thus to form the via portion connected to the second electrode portion, the via portion can be formed so as not to reach the dielectric film and the first electrode portion. In the electronic component thus manufactured, therefore, higher degree of freedom is granted for designing the two-dimensional size of the second electrode portion of the capacitor unit in a small size, free from the restriction by the two-dimensional size (or diameter) of the via portion to be connected to the second electrode portion. Such electronic component facilitates reducing the static capacitance of the capacitor unit while satisfying the requirement for reduction in dimensions of the electronic component and, consequently, is appropriate for constituting an integrated electronic component.

A second aspect of the present invention provides a method of manufacturing an electronic component. The method of manufacturing an electronic component including: a base material; an electrode pad provided on the base material, the electrode pad having a stacked structure including a first portion having a first pad-surface on the side of the base material and a second pad-surface opposite to the first pad-surface, and a second portion joined to the first portion; a capacitor unit having a stacked structure including a first electrode portion provided on the base material, a second electrode portion having a first electrode-surface facing the first electrode portion and a second electrode-surface opposite to the first electrode-surface, and a dielectric portion interposed between the first and the second electrode portion; and a wiring portion including a joining portion extending along the base material and joined to the second electrode-surface of the second electrode portion. The method comprises: forming an insulating film on the base material so as to cover the first portion and the capacitor unit after forming at least the first portion of the electrode pad, and the first electrode portion, the dielectric portion and the second electrode portion of the capacitor unit on the base material; and providing the insulating film with a first opening for forming the second portion such that at least part of the second pad-surface of the first portion is exposed, and a second opening for forming the wiring portion such that at least part of the second electrode-surface of the second electrode portion is exposed (opening formation step). The opening formation step may include performing an etching process (for example, wet etching process) over the insulating film, through a predetermined resist pattern provided thereon.

The opening formation step thus arranged allows stopping the etching process when at least a part of the second surface of the first portion, which is to constitute a part of the electrode pad, and at least a part of the second surface of the second electrode portion of the capacitor unit are properly exposed, thereby preventing the opening for the wiring portion from reaching the dielectric film and the first electrode portion. Accordingly, when performing for example an electroplating process to deposit a conductor material in the opening for the wiring portion after the opening formation step, thus to form the wiring portion connected to the second electrode portion, the wiring portion can be formed so as not to reach the dielectric film and the first electrode portion. In the electronic component thus manufactured, therefore, higher degree of freedom is granted for designing the two-dimensional size of the second electrode portion of the capacitor unit in a small size, free from the restriction by the shape of the wiring portion to be connected to the second electrode portion. Such electronic component facilitates reducing the static capacitance of the capacitor unit while satisfying the requirement for reduction in dimensions of the electronic component and, consequently, is appropriate for constituting an integrated electronic component.

A third aspect of the present invention provides a method of manufacturing an electronic component. The method of manufacturing an electronic component including: a base material; an electrode pad provided on the base material, the electrode pad having a stacked structure including a first portion having a first pad-surface on the side of the base material and a second pad-surface opposite to the first pad-surface, and a second portion joined to the first portion; a spiral coil provided on the base material, the spiral coil including an inner end portion having a first coil-surface on the base material side and a second coil-surface opposite to the first coil-surface; and a wiring portion including a via portion having a wiring-surface facing the base material, the wiring-surface being joined to the second coil-surface of the inner end portion; wherein the wiring-surface of the via portion includes an extending portion extending outward of a periphery of the second coil-surface of the inner end portion. The method comprises: forming an insulating film on the base material so as to cover the first portion and the spiral coil after forming at least the first portion of the electrode pad, and the spiral coil having the inner end portion on the base material; and providing the insulating film with a first opening for forming the second portion such that at least part of the second pad-surface of the first portion is exposed, and a second opening for forming the via portion such that at least part of the second coil-surface of the inner end portion is exposed (opening formation step). The opening formation step may include performing an etching process (for example, wet etching process) over the insulating film, through a predetermined resist pattern provided thereon.

The opening formation step thus arranged allows stopping the etching process when at least a part of the second surface of the first portion, which is to constitute a part of the electrode pad, and at least a part of the second surface of the inner end portion of the spiral coil are properly exposed, thereby preventing the opening for the via portion from reaching the base material. Accordingly, when performing for example an electroplating process to deposit a conductor material in the opening for the via portion after the opening formation step, thus to form the via portion connected to the inner end portion, the via portion can be formed so as not to reach the base material. In the electronic component thus manufactured, therefore, higher degree of freedom is granted for designing the two-dimensional size of the inner end portion of the spiral coil in a small size, free from the restriction by the two-dimensional size (or diameter) of the via portion to be connected to the inner end portion. Such electronic component facilitates achieving a high Q value required from the spiral coil while satisfying the requirement for reduction in dimensions of the electronic component and, consequently, is appropriate for constituting an integrated electronic component.

A fourth aspect of the present invention provides an electronic component comprising a base material, a capacitor unit, and a wiring portion. The capacitor unit has a stacked structure including a first electrode portion provided on the base material, a second electrode portion having a first electrode-surface facing the first electrode portion and a second electrode-surface opposite to the first electrode-surface, and a dielectric portion interposed between the first and the second electrode portion. The wiring portion includes a via portion having a wiring-surface facing the base material, the wiring-surface being joined to the second electrode-surface of the second electrode portion. The wiring-surface includes an extending portion extending outward of a periphery of the second electrode-surface. The electronic component thus constituted may be manufactured by the method according to the first aspect of the present invention, and eliminates the restriction by the two-dimensional size (or diameter) of the via portion to be connected to the second electrode portion, when designing the two-dimensional size of the second electrode portion of the capacitor unit. Such electronic component facilitates reducing the static capacitance of the capacitor unit while satisfying the requirement for reduction in dimensions of the electronic component and, consequently, is appropriate for constituting an integrated electronic component.

Preferably, the second electrode-surface is located at an inner position of a peripheral edge of the wiring-surface. Such configuration facilitates achieving a high Q value required from the spiral coil while satisfying the requirement for reduction in dimensions of the electronic component.

A fifth aspect of the present invention provides an electronic component comprising a base material, a capacitor unit, and a wiring portion. The capacitor unit has a stacked structure including a first electrode portion provided on the base material, a second electrode portion having a first electrode-surface facing the first electrode portion and a second electrode-surface opposite to the first electrode-surface, and a dielectric portion interposed between the first and the second electrode portion. The wiring portion includes a joining portion extending along the base material and joined to the second electrode-surface of the second electrode portion. The electronic component thus constituted may be manufactured by the method according to the second aspect of the present invention, and eliminates the restriction by the shape of the wiring portion to be connected to the second electrode portion, when designing the two-dimensional size of the second electrode portion of the capacitor unit. Such electronic component facilitates reducing the static capacitance of the capacitor unit while satisfying the requirement for reduction in dimensions of the electronic component and, consequently, is appropriate for constituting an integrated electronic component.

Preferably, The electronic component further comprises a passive component provided on the base material. The wiring portion constitutes at least part of an electrical path between the passive component and the capacitor unit. With or instead of such structure, the electronic component may further comprise an electrode pad provided on the base material; wherein the wiring portion constitutes at least part of an electrical path between the electrode pad and the capacitor unit. The electronic component according to the fourth and the fifth aspect of the present invention may be an integrated electronic component including the foregoing structure.

A sixth aspect of the present invention provides an electronic component comprising a base material, a spiral coil serving as an inductor, and a wiring portion. The spiral coil includes an inner end portion having a first coil-surface on the base material side and a second coil-surface opposite to the first coil-surface, the spiral coil being provided on the base material. The wiring portion includes a via portion having a wiring-surface facing the base material, the wiring-surface being joined to the second coil-surface of the inner end portion. The wiring-surface includes an extending portion extending outward of a periphery of the second coil-surface. The electronic component thus constituted may be manufactured by the method according to the third aspect of the present invention, and eliminates the restriction by the two-dimensional size (or diameter) of the via portion to be connected to the inner end portion, when designing the two-dimensional size of the inner end portion of the spiral coil. Such electronic component facilitates achieving a high Q value required from the spiral coil while satisfying the requirement for reduction in dimensions of the electronic component and, consequently, is appropriate for constituting an integrated electronic component.

Preferably, the second coil-surface is located at an inner position of a peripheral edge of the wiring-surface. Such configuration facilitates reducing the static capacitance of the capacitor unit while satisfying the requirement for reduction in dimensions of the electronic component.

Preferably, the electronic component may further comprise a passive component provided on the base material; wherein the wiring portion constitutes at least part of an electrical path between the passive component and the spiral coil. With or instead of such structure, the electronic component may further comprise an electrode pad provided on the base material; wherein the wiring portion constitutes at least part of an electrical path between the electrode pad and the spiral coil. The electronic component according to the sixth aspect of the present invention may be an integrated electronic component including the foregoing structure.

DETAILED DESCRIPTION OF THE PREFERRED EMBODIMENT

Figure 1:
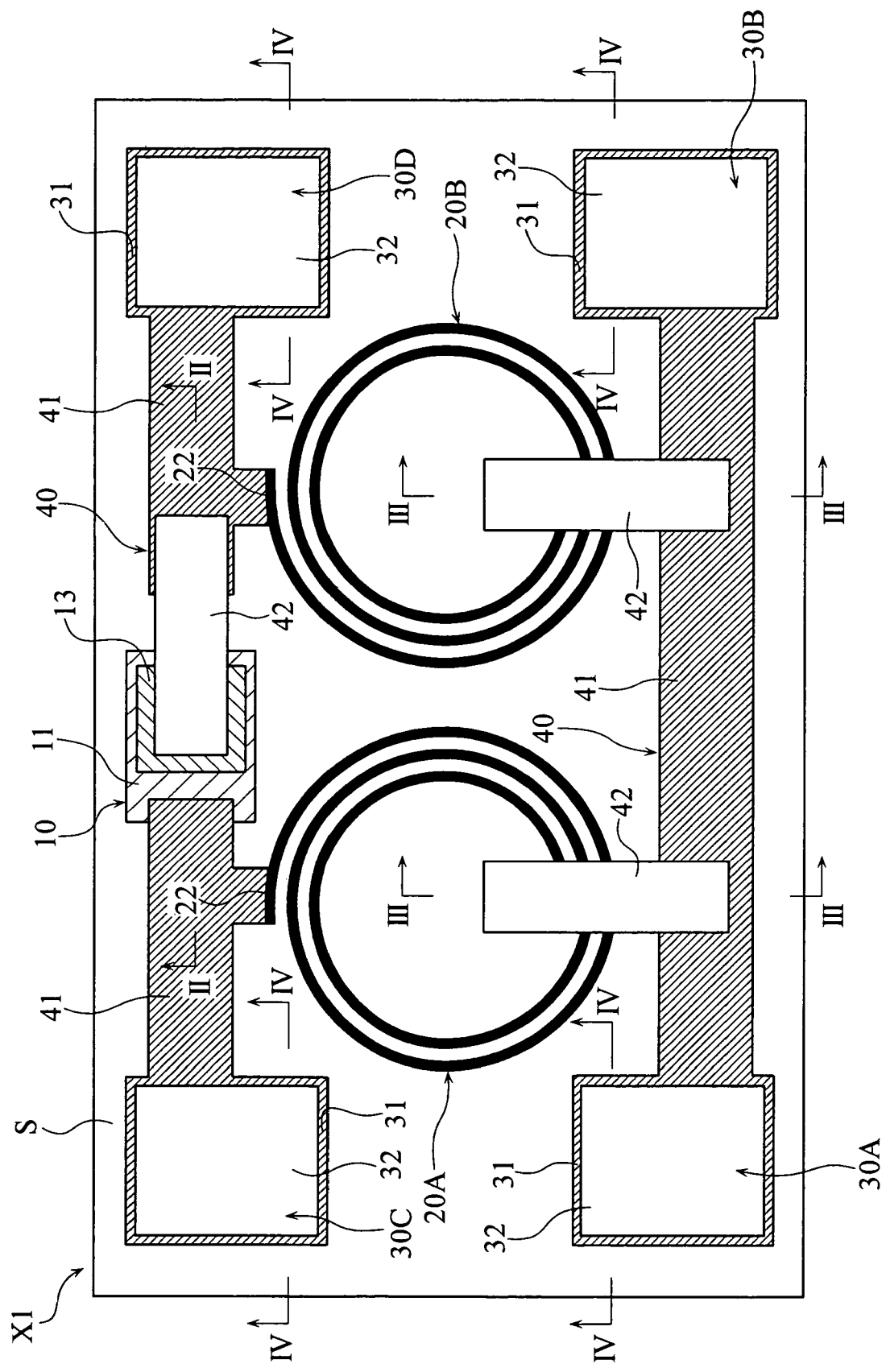
FIG. 1 is a plan view showing an integrated electronic component according to a first embodiment of the present invention.
Figure 2:
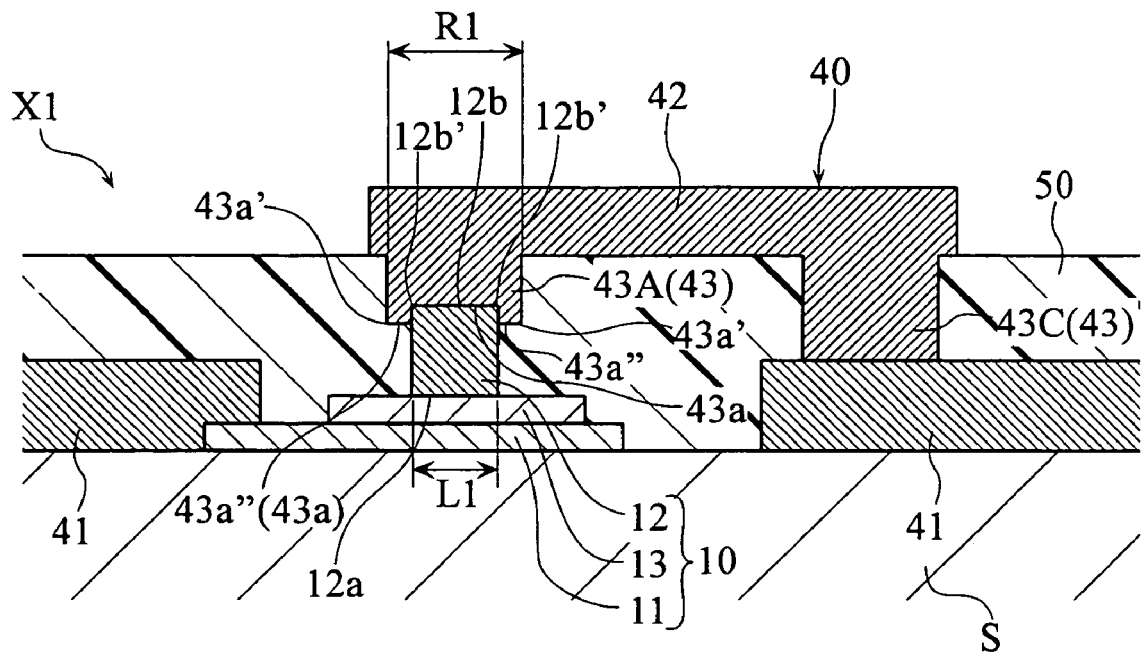
FIG. 2 is a cross-sectional view taken along the line II-II in FIG. 1.
Figure 3:
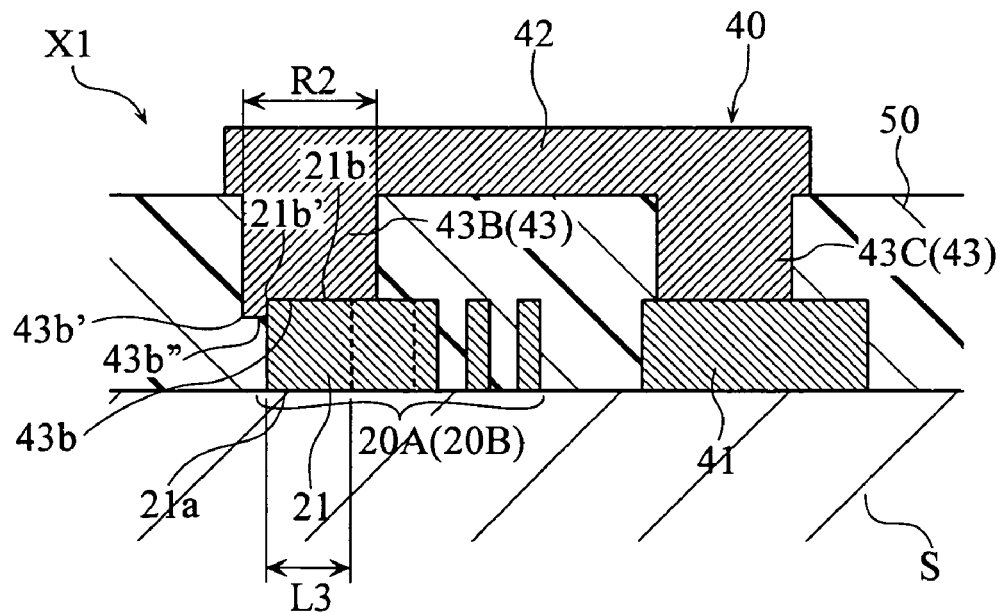
FIG. 3 is a cross-sectional view taken along the line III-III in FIG. 1.
Figure 4:
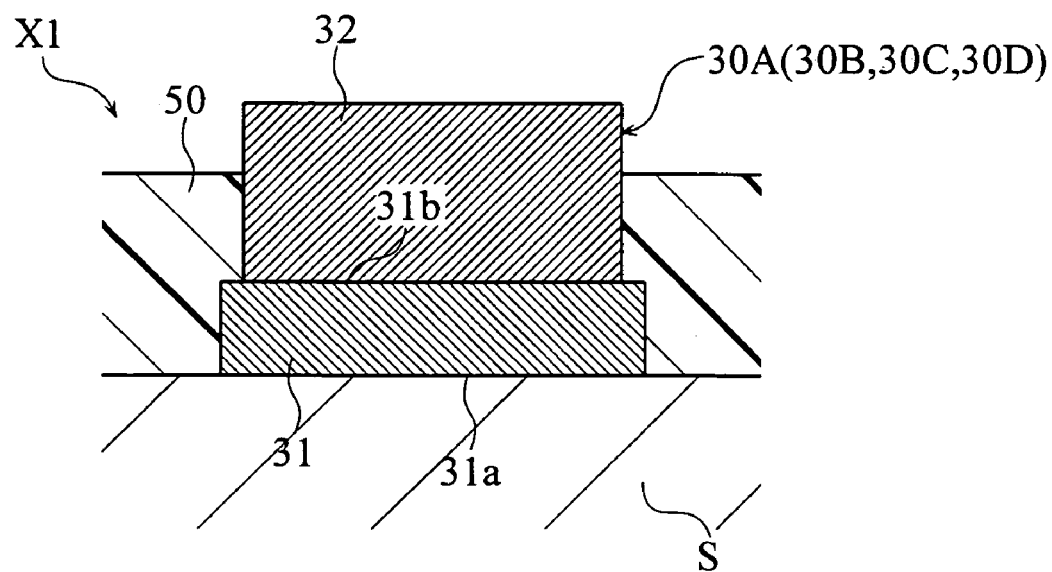
FIG. 4 is a cross-sectional view taken along the line IV-IV in FIG. 1.

FIGS. 1 to 4 depict an integrated electronic component X1 according to a first embodiment of the present invention. FIG. 1 is a plan view of the integrated electronic component X1. FIGS. 2, 3 and 4 are cross-sectional views taken along the lines II-II, III-III and IV-IV in FIG. 1, respectively.

Figure 5:
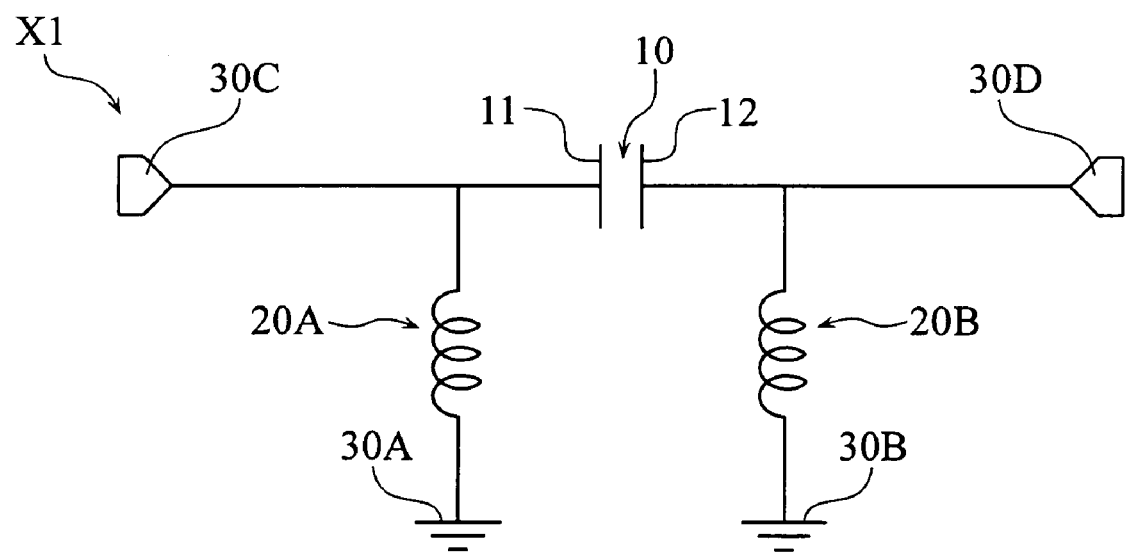
FIG. 5 is a circuit diagram of the integrated electronic component shown in FIG. 1.

The integrated electronic component X1 includes a substrate S, a capacitor 10, spiral coils 20A, 20B, electrode pads 30A, 30B, 30C, 30D, a wiring 40, and a protecting film 50 (not shown in FIG. 1), and has a circuit configuration shown in FIG. 5.

The substrate S may be a semiconductor substrate, a quartz substrate, a glass substrate, a silicon on insulator (SOI) substrate, a silicon on quartz (SOQ) substrate, or a silicon on glass (SOG) substrate. The semiconductor substrate may be constituted of a silicon material, such as monocrystalline silicon.

The capacitor 10 has a stacked structure including electrode films 11, 12 and a dielectric film 13 as shown in FIG. 2. The electrode film 11 is a lower electrode film formed in a pattern on the substrate S, and may be constituted of Cu, Au, Ag or Al. The electrode film 11 may have a multilayer structure including a plurality of conductor layers. The electrode film 11 has a thickness of 1 to 5 µm, for instance. The electrode film 12 is an upper electrode film having a first surface 12a facing the electrode film 11 via the dielectric film 13 and a second surface opposite to the first surface, and may be constituted of Cu, Au, Ag or Al. The electrode film 12 has a thickness of, for instance, 5 to 20 µm. The dielectric film 13 may be constituted of silicon oxide, silicon nitride, aluminum oxide, tantalum oxide or titanium oxide. The dielectric film 13 has a thickness of 0.1 to 0.5 µm, for instance.

Each of the spiral coils 20A, 20B is flat spiral coils patterned on the substrate S as shown in FIGS. 1 and 3, and has an inner end portion 21 (shown in FIG. 3) and an outer end portion 22 (shown in FIG. 1). The inner end portion 21 has a first surface 21a on the side of the substrate S and a second surface 21b opposite to the first surface 21a. The spiral coils 20A, 20B may have a thickness of 5 to 20 µm. Preferable materials of the spiral coils 20A, 20B include Cu, Au, Ag and Al.

The electrode pads 30A to 30D serve for external connection. The electrode pads 30A, 30B serve as terminals for ground connection, while the electrode pads 30C, 30D serve as input/output terminals of electrical signals, as shown in FIG. 5. Each of the electrode pads 30A to 30D has a stacked structure including a first portion 31 and a second portion 32, as shown in FIG. 4. The first portion 31 has a first surface 31a on the side of the substrate S and a second surface 31b opposite to the first surface 31a, and may be constituted of Cu, Au, Ag, or Al. The second portion 32 may be constituted of a Ni body with the upper surface coated with a Au film.

The wiring 40 serves to electrically connect the components on the substrate S, and includes a first wiring portion 41 patterned on the substrate S, a second wiring portion 42 patterned mainly on the protecting film 50, and a via 43 extending thickness wise of the integrated electronic component X1, serving as a third wiring portion, as shown in FIGS. 1 to 3. The via 43 includes a via 43A connected to the electrode film 12 of the capacitor 10, a via 43B connected to the inner end portion 21 of the spiral coils 20A, 20B, and a via 43C connecting the first wiring portion 41 and the second wiring portion 42. For the sake of explicitness of the drawings, only the first wiring portion 41 out of the wiring 40 is indicated by hatching in FIG. 1. The first wiring portion 41 may be constituted of Cu, Au, Ag, or Al as the electrode film 11, and may have a multilayer structure including a plurality of conductor layers. The first wiring portion 41 has a thickness of 1 to 5 µm, for instance. Preferable materials of the second wiring portion 42 and the via 43 include Cu, Au, Ag, Al, and Ni, and the second wiring portion 42 may have a thickness of 5 to 20 µm.

Figure 6:
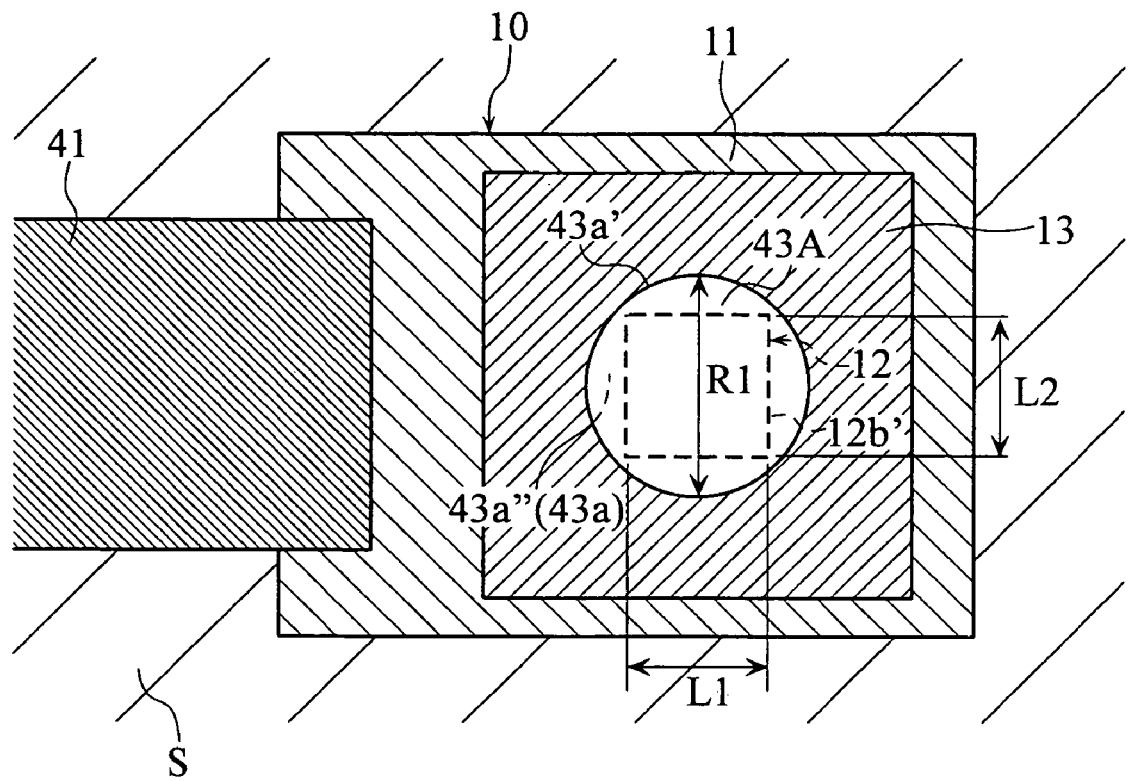
FIG. 6 is an enlarged fragmentary plan view showing the integrated electronic component shown in FIG. 1.

As shown in FIG. 2, the via 43A has a surface 43a on the side of the substrate S, and is joined to the second surface 12b of the electrode film 12 of the capacitor 10 via the surface 43a. The via 43A has, as shown in FIG. 6, a larger two-dimensional size than the electrode film 12a (FIG. 6 is an enlarged fragmentary plan view showing the capacitor 10 and the periphery thereof in the integrated electronic component X1, in which the second wiring portion 42 and the protecting film 50 are not shown but the electrode film 12 is indicated by broken lines). To be more detailed, as shown in FIGS. 2 and 6, the diameter R1 of the via 43A is larger than the length L1, L2 of the electrode film 12. The second surface 12b of the electrode film 12 is located at an inner position of the peripheral edge 43a' of the surface 43a of the via 43A facing the substrate S. The surface 43a includes an extended portion 43a'' extending outward of the periphery 12b' of the second surface 12b.

Referring to FIG. 5, the capacitor 10 is electrically connected to the electrode pads 30C, 30D and the spiral coils 20A, 20B. More specifically, as shown in FIG. 1, the electrode film 11 of the capacitor 10 is electrically connected to the electrode pad 30C and the outer end portion 22 of the spiral coil 20A via part of the first wiring portion 41, and, as shown in FIGS. 1 and 2, the electrode film 12 of the capacitor 10 is electrically connected to the electrode pad 30D and the outer end portion 22 of the spiral coil 20B, via the via 43A connected to the electrode film 12, the second wiring portion 42 continuous with the via 43A, the via 43C continuous with the second wiring portion 42, and the first wiring portion 41 continuous with the via 43C.

Figure 7:
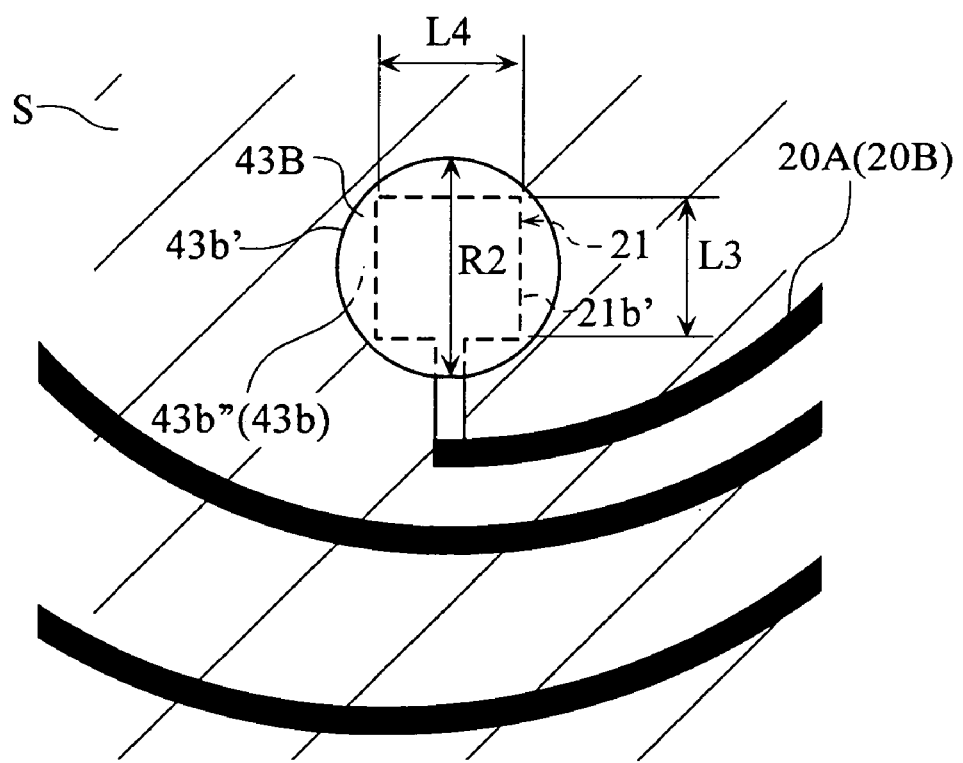
FIG. 7 is an enlarged fragmentary plan view showing another portion of the integrated electronic component shown in FIG. 1.

Referring to FIG. 3, the via 43B has a surface 43b facing the substrate S, and is joined to the second surface 21b of the inner end portion 21 of the spiral coil 20A or the spiral coil 20B, via the surface 43b. The via 43B has, as shown in FIG. 7, a larger two-dimensional size than the inner end portion 21 (FIG. 7 is an enlarged fragmentary plan view showing the spiral coil 20A or the spiral coil 20B and the periphery thereof in the integrated electronic component X1, in which the second wiring portion 42 and the protecting film 50 are not shown but the inner end portion 21 is indicated by broken lines). To be more detailed, as shown in FIGS. 2 and 6, the diameter R2 of the via 43B is larger than the length L3, L4 of the inner end portion 21; and the surface 43b of the via 43B on the side of the substrate S includes an extension 43b'' extending outward of the periphery 21b' of the second surface 21b of the inner end portion 21.

Referring further to FIG. 3, the spiral coils 20A, 20B are respectively electrically connected to a part of the first wiring portion 41 on the substrate S, via the via 43B joined to the inner end portion 21, the second wiring portion 42 continuous with the via 43B, and the via 43C continuous with the second wiring portion 42. Thus, the spiral coils 20A, 20B are electrically connected to the electrode pads 30A, 30B, via the first wiring portion 41.

The protecting film 50 may be constituted of a polyimide or benzocyclobutene (BCB), and covers the capacitor 10, the spiral coils 20A, 20B, the first wiring portion 41, and the via 43, as shown in FIGS. 2 and 3.

FIGS. 8A to 10D illustrate a manufacturing method of the integrated electronic component X1. FIGS. 8A to 10D represent the progress of the formation process of the capacitor 10, a part of the spiral coil 20, an electrode pad 30 (corresponding to the electrode pads 30A to 30D), and a part of a wiring 40 shown in FIG. 10D, in cross-sectional views of a region including these constituents. The cross-sectional views progressively depict a model of a plurality of predetermined regions included in a single section where the integrated electronic component is formed, on a material substrate to be processed.

Figure 8A:
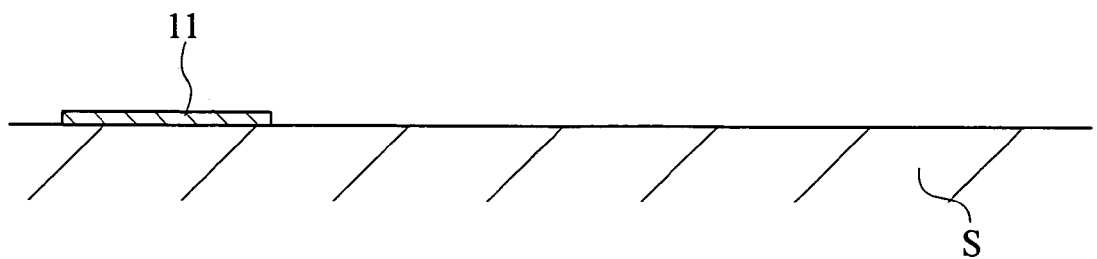
FIGS. 8A to 8D are cross-sectional views showing a manufacturing process of the integrated electronic component shown in FIG. 1.

To form the integrated electronic component X1, referring first to FIG. 8A, the electrode film 11 of the capacitor 10 is formed on the substrate S. Specifically, a sputtering process may be performed to deposit a predetermined metal material on the substrate S, followed by a predetermined wet or dry etching process for shaping the metal film in a pattern, to form the electrode film 11.

Figure 8B:
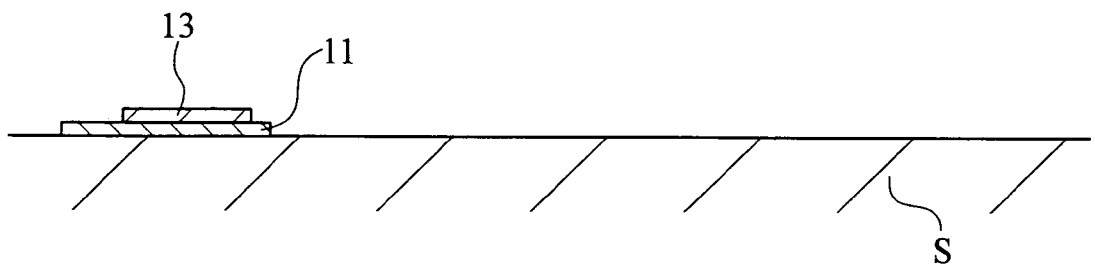

Then as shown in FIG. 8B, the dielectric film 13 is formed on the electrode film 11. Specifically, a sputtering process may be performed to deposit a predetermined dielectric material at least on the electrode film 11, followed by a predetermined wet or dry etching process for shaping the dielectric film in a pattern, to form the dielectric film 13.

A seed layer (not shown) for electroplating is then formed on the substrate S, so as to cover the electrode film 11 and the dielectric film 13. The seed layer may be formed by a CVD or a sputtering process.

Figure 8C:
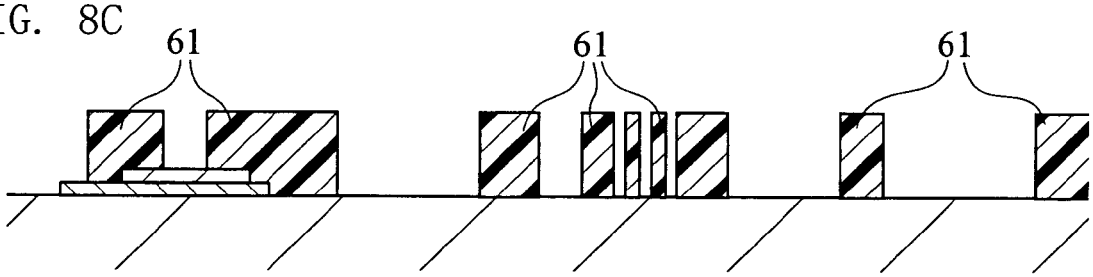

Referring to FIG. 8C, a resist pattern 61 is formed. The resist pattern 61 has openings corresponding to the pattern shape of the electrode film 12 of the capacitor 10, the spiral coil 20, the first portion 31 of the electrode pad 30, and the first wiring portion 41 of the wiring 40. To form the resist pattern 61, a liquid photoresist is firstly deposited over the substrate S from a position above the electrode film 11 and the dielectric film 13, by a spin coating process. The photoresist film is then patterned through an exposure and a subsequent development process. The resist pattern to be described later may also be formed through a similar process.

Figure 8D:
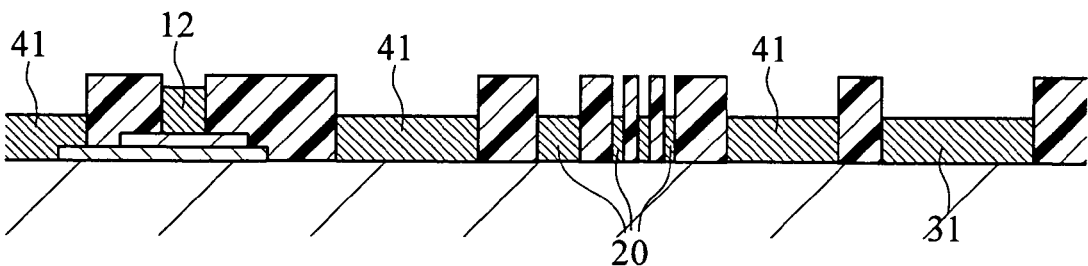

An electroplating process is then performed to deposit a predetermined metal material in the openings of the resist pattern 61, to thereby form the electrode film 12, the spiral coil 20, the first portion 31, and the first wiring portion 41, as shown in FIG. 8D. In this electroplating process, the seed layer is energized.

Figure 9A:
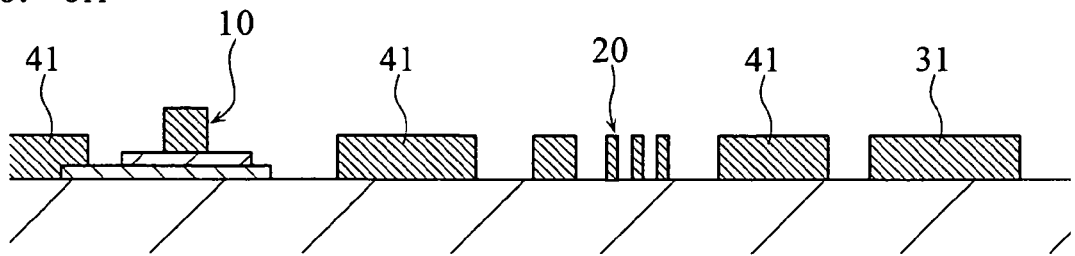
FIGS. 9A to 9D are cross-sectional views showing a manufacturing process subsequent to FIG. 8D.
Figure 9B:
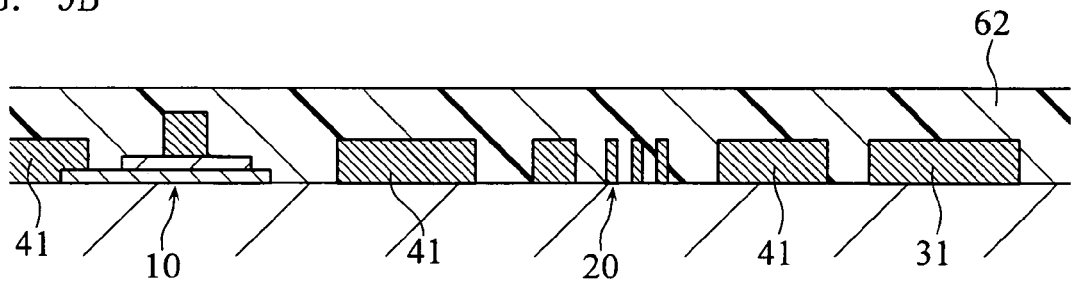

Proceeding to FIG. 9A, the resist pattern 61 is removed, for example by applying a predetermined stripping solution, followed by removal of an exposed portion of the seed layer. Then as shown in FIG. 9B, an insulating film 62 is formed so as to cover the capacitor 10, the spiral coil 20, the first portion 31, and the first wiring portion 41. Specifically, a spin coating process may be employed to deposit a liquid photoresist on the substrate S, to form the insulating film 62.

Figure 9C:
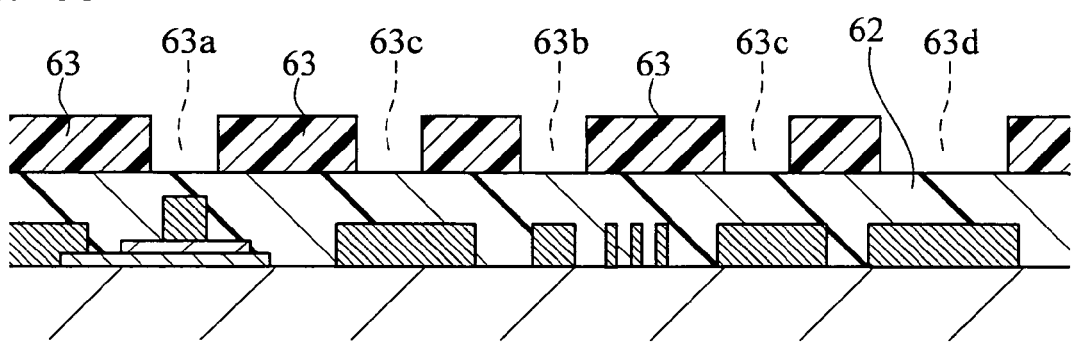

Referring to FIG. 9C, a resist pattern 63 is formed on the insulating film 62. The resist pattern 63 is formed with openings 63a, 63b, 63c corresponding to the pattern of the vias 43A, 43B, 43C, and an opening 63d corresponding to the pattern of the second portion 32 of the electrode pad 30.

Figure 9D:
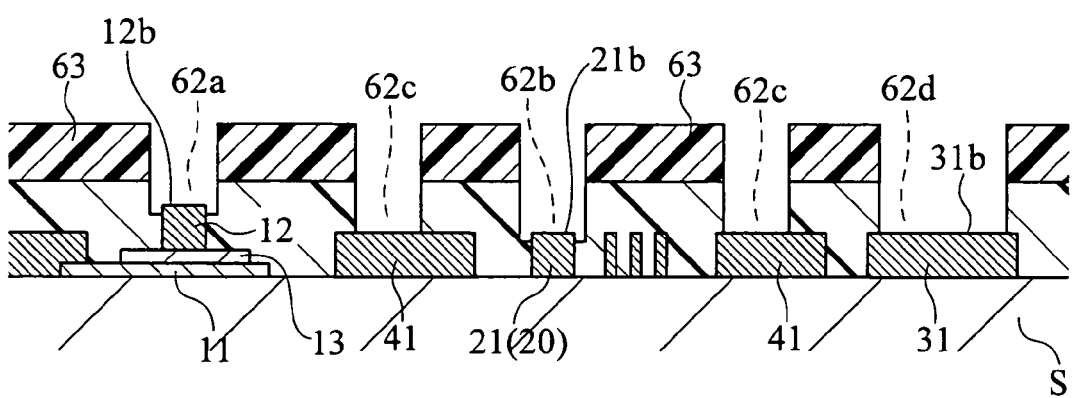

A wet etching process is then performed on the insulating film 62 utilizing the resist pattern 63 as the mask, as shown in FIG. 9D. As a result, the insulating film 62 becomes provided with an opening 62a for the via 43A formed such that an entirety of the second surface 12b of the electrode film 12 is exposed, an opening 62b for the via 43B formed such that an entirety of the second surface 21b of the inner end portion 21 is exposed, an opening 62c for the via 43C formed such that at least a part of an upper surface of the first wiring portion 41 in the drawing is exposed, and an opening 62d for the second portion 32 formed such that a part of the second surface 31b of the first portion 31 is exposed. The opening 62a does not reach the dielectric film 13 and the electrode film 11. The opening 62b does not reach the substrate S.

Figure 10A:
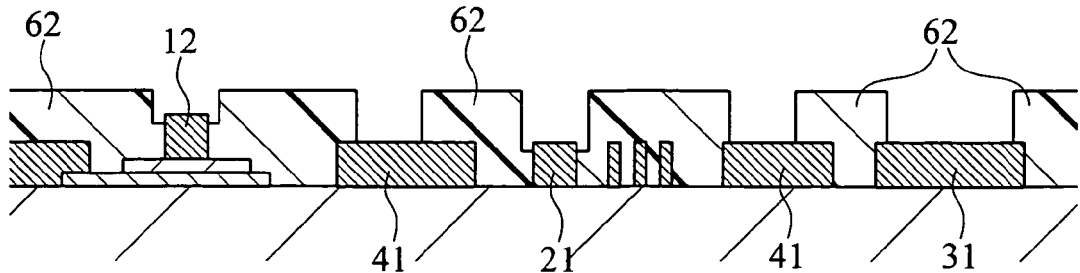
FIGS. 10A to 10D are cross-sectional views showing a manufacturing process subsequent to FIG. 9D.
Figure 10B:
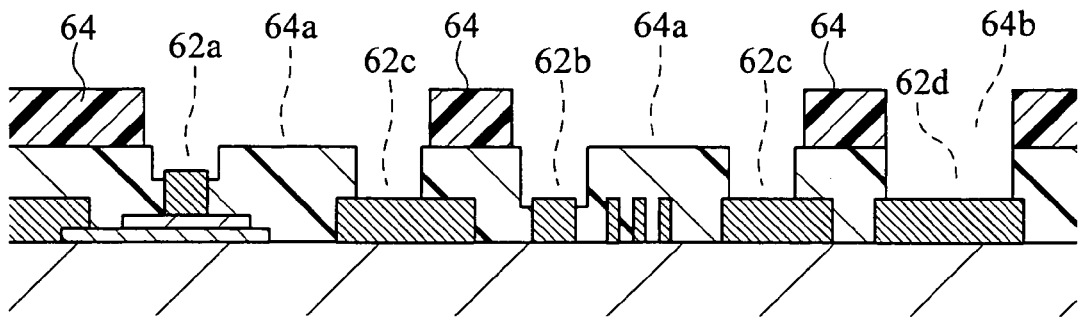

Proceeding to FIG. 10A, the resist pattern 63 is removed. A seed layer for electroplating is then formed over the surface of the insulating film 62, and exposed surfaces of the electrode film 12, the inner end portion 21, the first portion 31, and the first wiring portion 41, after which a resist pattern 64 is formed on the insulating film 62, as shown in FIG. 10B. The resist pattern 64 is formed with an opening 64a corresponding to the pattern of the second wiring portion 42, and an opening 64b corresponding to the pattern of the second portion 32 of the electrode pad 30.

Figure 10C:
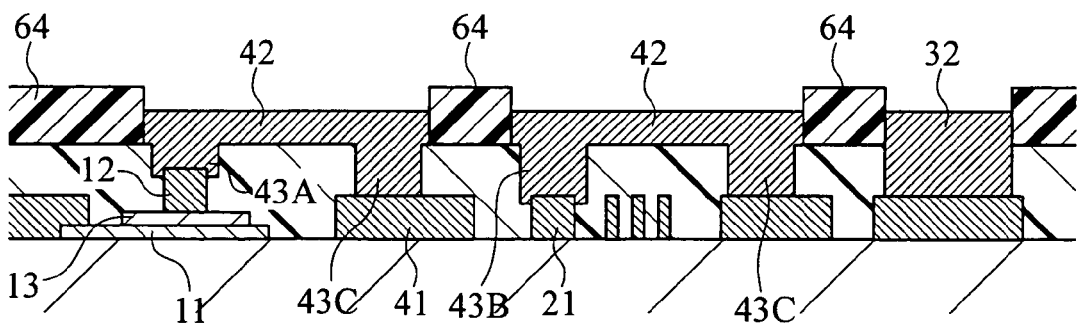

Referring to FIG. 10C, an electroplating process is then performed to deposit a predetermined metal material in the openings 62a to 62d of the insulating film 62, and in the openings 64a, 64b of the resist pattern 64, to thereby form the vias 43A to 43C, the second wiring portion 42, and the second portion 32. In this electroplating process, the seed layer is energized. The via 43A does not reach the dielectric film 13 and the electrode film 11. The via 43B does not reach the substrate S.

Figure 10D:
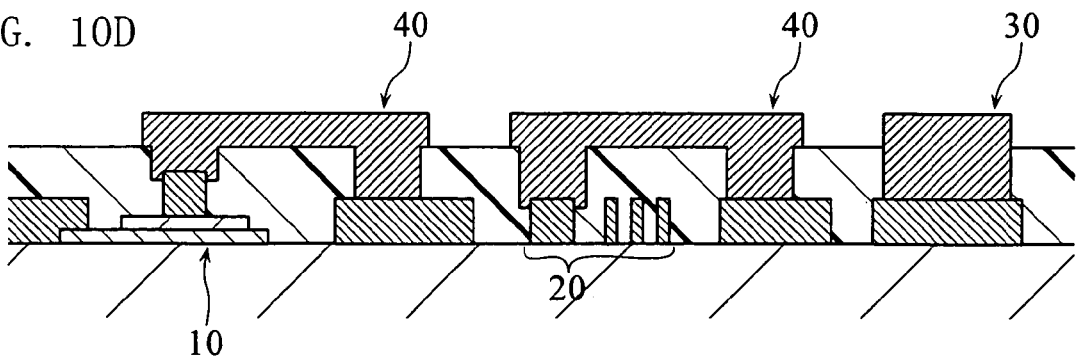

Then the resist pattern 64 is removed, as shown in FIG. 10D. This is followed by removal of an exposed portion of the seed layer. Throughout the foregoing process, the integrated electronic component X1 shown in FIG. 1 can be manufactured.

The process described referring to FIG. 9D allows stopping the etching process when at least a part of the second surface 31b of the first portion 31, which is to constitute a part of the electrode pad 30, as well as an entirety of the second surface 12b of the electrode film 12 of the capacitor 10 and an entirety of the second surface 21b of the inner end portion 21 of the spiral coil 20 are properly exposed, thereby preventing the opening 62a from reaching the dielectric film 13 and the electrode film 11, and the opening 62b from reaching the base material, as already stated. Accordingly, in the process described referring to FIG. 10C, the via 43A can be formed so as not to reach the dielectric film 13 and the electrode film 11, and the via 43B so as not to reach the substrate S. In the integrated electronic component X1, therefore, higher degree of freedom is granted for designing the two-dimensional size of the electrode film 12 of the capacitor 10 in a small size, free from the restriction by the two-dimensional size or the diameter R1 (shown in FIG. 2, for example) of the via 43A to be connected to the electrode film 12, and for designing the two-dimensional size of the inner end portion 21 of the spiral coil 20 in a small size, free from the restriction by the two-dimensional size or the diameter R2 (shown in FIG. 3, for example) of the via 43B to be connected to the inner end portion 21. The integrated electronic component X1 thus structured facilitates reducing the static capacitance of the capacitor 10 and achieving a high Q value required from the spiral coils 20A, 20B, while satisfying the requirement for reduction in dimensions of the electronic component.

Figure 11:
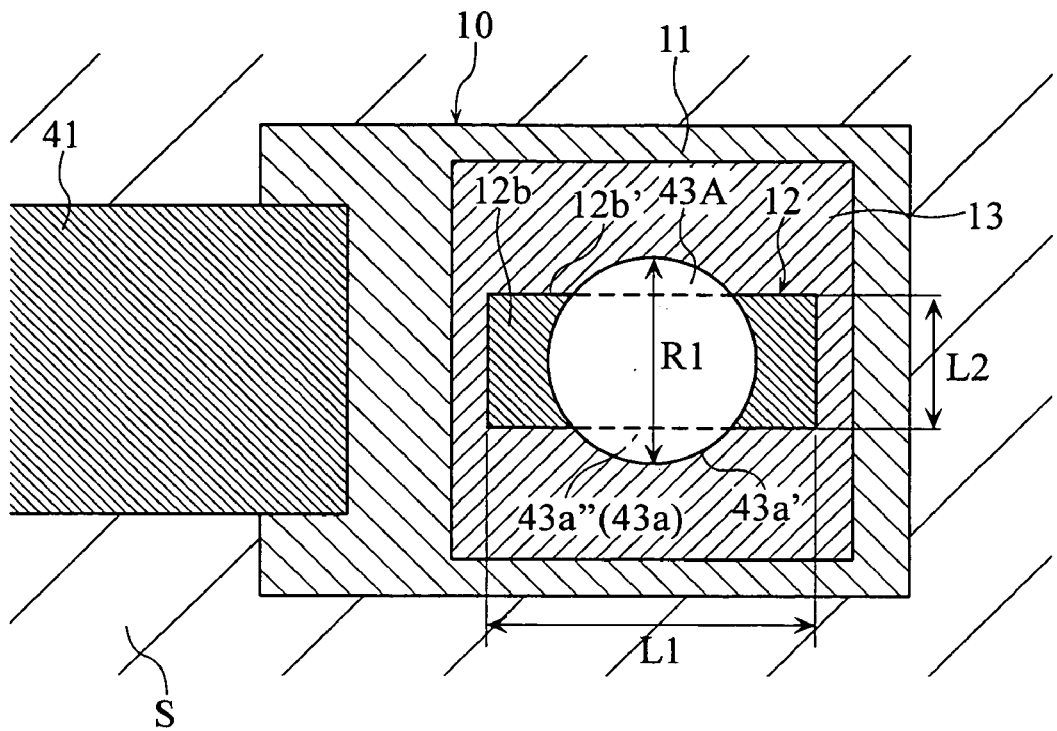
FIG. 11 is an enlarged fragmentary plan view showing a variation of the integrated electronic component according to the first embodiment, corresponding to FIG. 6 taken out of FIG. 1.

FIG. 11 is an enlarged fragmentary plan view showing a variation of the integrated electronic component X1, corresponding to FIG. 6 taken out of FIG. 1 showing the integrated electronic component X1. In this variation, the diameter R1 of the via 43A is larger than the length L2, but smaller than the length L1 of the electrode film 12 of the capacitor 10. In other words, although the surface 43a of the via 43A on the side of the substrate S includes the extension 43a" extending along an outer surface of an end portion 12b' of the second surface 12b of the electrode film 12, the second surface 12b partially extends outward from a peripheral edge 43a' of the surface 43a. Such configuration can also be included in the present invention, and facilitates reducing the static capacitance of the capacitor 10 while satisfying the requirement for reduction in dimensions of the electronic component.

Figure 12:
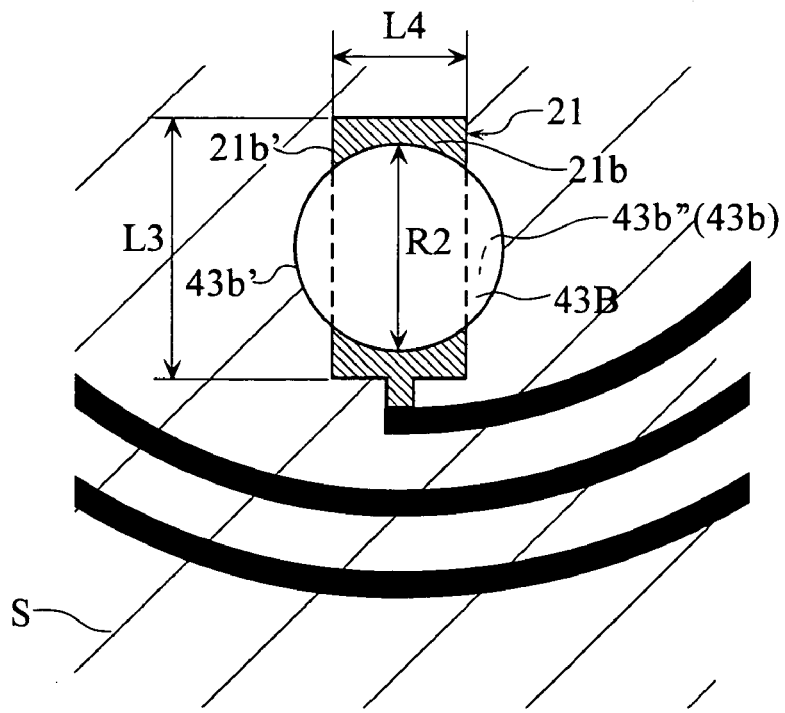
FIG. 12 is an enlarged fragmentary plan view showing a variation of the integrated electronic component according to the first embodiment, corresponding to FIG. 7 taken out of FIG. 1.

FIG. 12 is an enlarged fragmentary plan view showing another variation of the integrated electronic component X1, corresponding to FIG. 7 taken out of FIG. 1 showing the integrated electronic component X1. In this variation, the diameter R2 of the via 43B is larger than the length L4, but smaller than the length L3 of the inner end portion 21 of the spiral coil 20. In other words, although the surface 43b of the via 43B on the side of the substrate S includes the extension 43b" extending along an outer surface of an end portion 21b' of the second surface 21b of the inner end portion 21, the second surface 21b partially extends outward from a peripheral edge 43b' of the surface 43b. Such configuration can also be included in the present invention, and facilitates achieving a high Q value required from the spiral coils 20A, 20B, while satisfying the requirement for reduction in dimensions of the electronic component.

Figure 13:
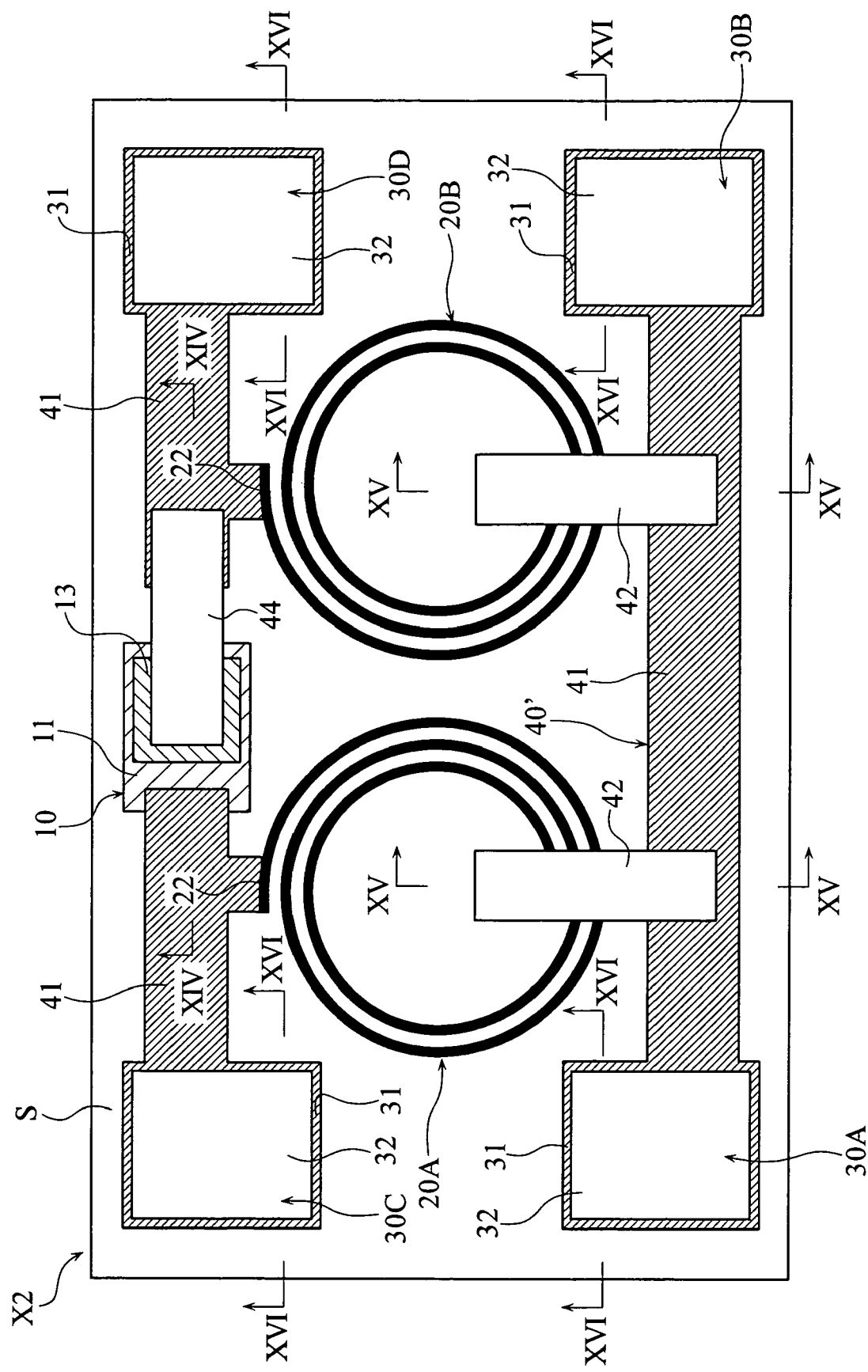
FIG. 13 is a plan view showing an integrated electronic component according to a second embodiment of the present invention.
Figure 14:
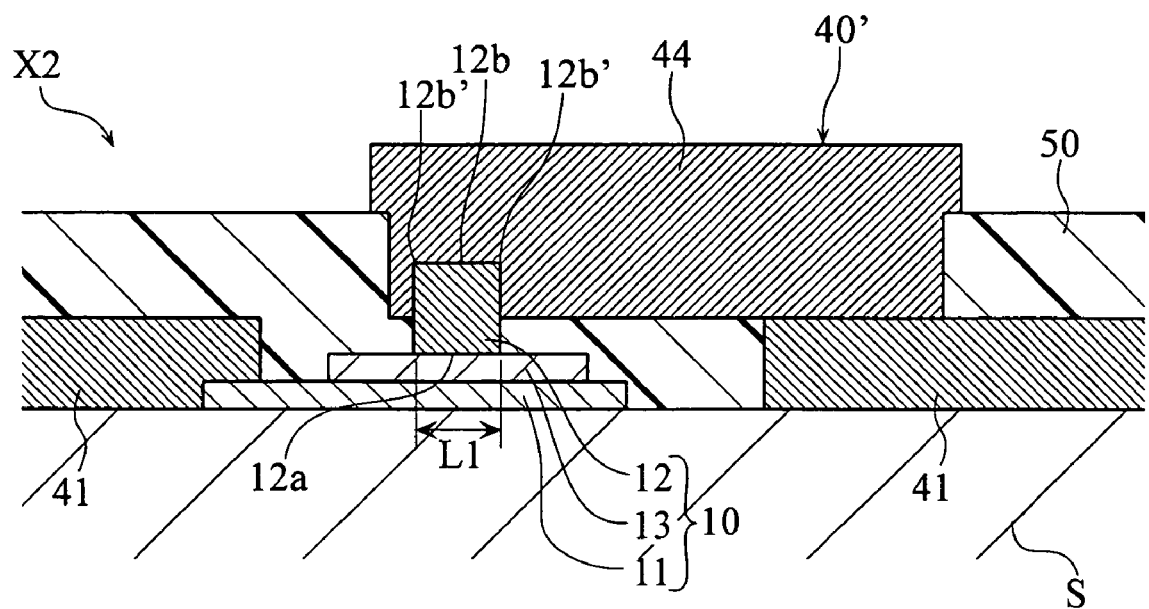
FIG. 14 is a cross-sectional view taken along the line XIV-XIV in FIG. 13.
Figure 15:
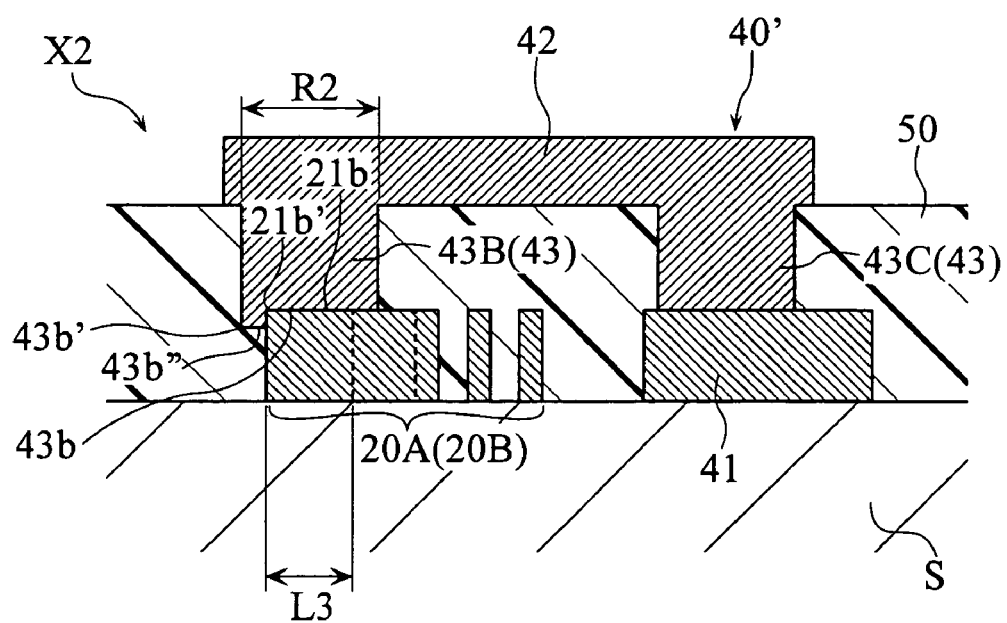
FIG. 15 is a cross-sectional view taken along the line XV-XV in FIG. 13.
Figure 16:
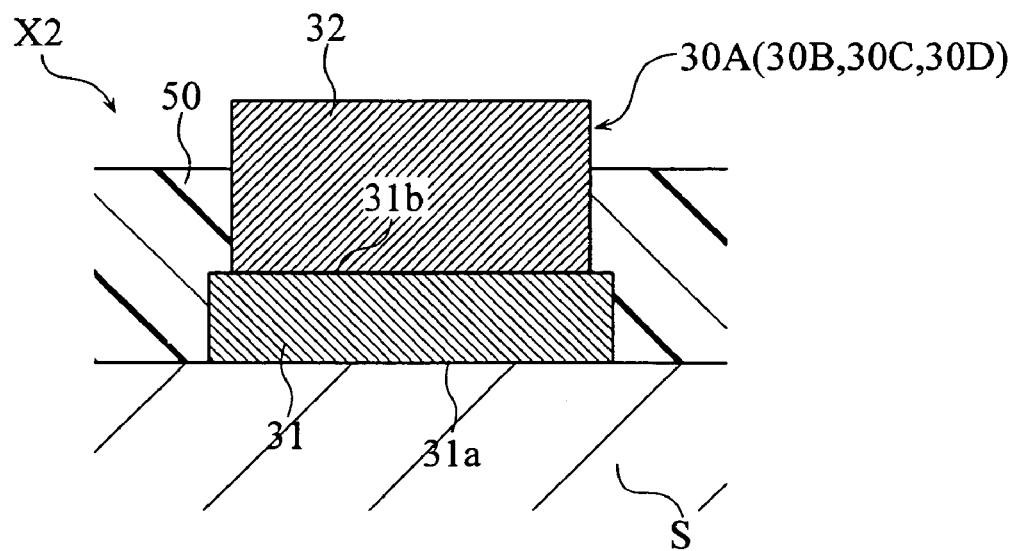
FIG. 16 is a cross-sectional view taken along the line XVI-XVI in FIG. 13.

FIGS. 13 to 16 illustrate an integrated electronic component X2 according to a second embodiment of the present invention. FIG. 13 is a plan view showing the integrated electronic component X2. FIGS. 14, 15, and 16 are cross-sectional views taken along the lines XIV-XIV, XV-XV, and XVI-XVI in FIG. 13, respectively. The integrated electronic component X2 includes a substrate S, a capacitor 10, spiral coils 20A, 20B, electrode pads 30A, 30B, 30C, 30D, a wiring 40', and a protecting film 50 (not shown in FIG. 13). The integrated electronic component X2 is substantially different from the foregoing integrated electronic component X1, in including the wiring 40' in place of the wiring 40.

The wiring 40' serves to electrically connect the components on the substrate S, and includes a first wiring portion 41 patterned on the substrate S, a second wiring portion 42 patterned mainly on the protecting film 50, and a via 43 extending thickness wise of the integrated electronic component X2, serving as a third wiring portion, as shown in FIGS. 13 to 15. The via 43 includes a via 43B connected to the inner end portion 21 of the capacitor 10, a via 43B connected to the inner end portion 21 of the spiral coils 20A, 20B, and a via 43C connecting the first wiring portion 41 and the second wiring portion 42. For the sake of explicitness of the drawings, only the first wiring portion 41 out of the wiring 40' is indicated by hatching in FIG. 13. The wiring 40' is different from the wiring 40 of the integrated electronic component X1, in including a fourth wiring portion 44 in place of the via 43A, the second wiring portion 42 continuous with the via 43A, and the via 43C continuous with the second wiring portion 42. Preferable materials of the fourth wiring portion 44 include Cu, Au, Ag, Al, and Ni, and the fourth wiring portion 44 may have a thickness of 5 to 20 μm.

Figure 17:
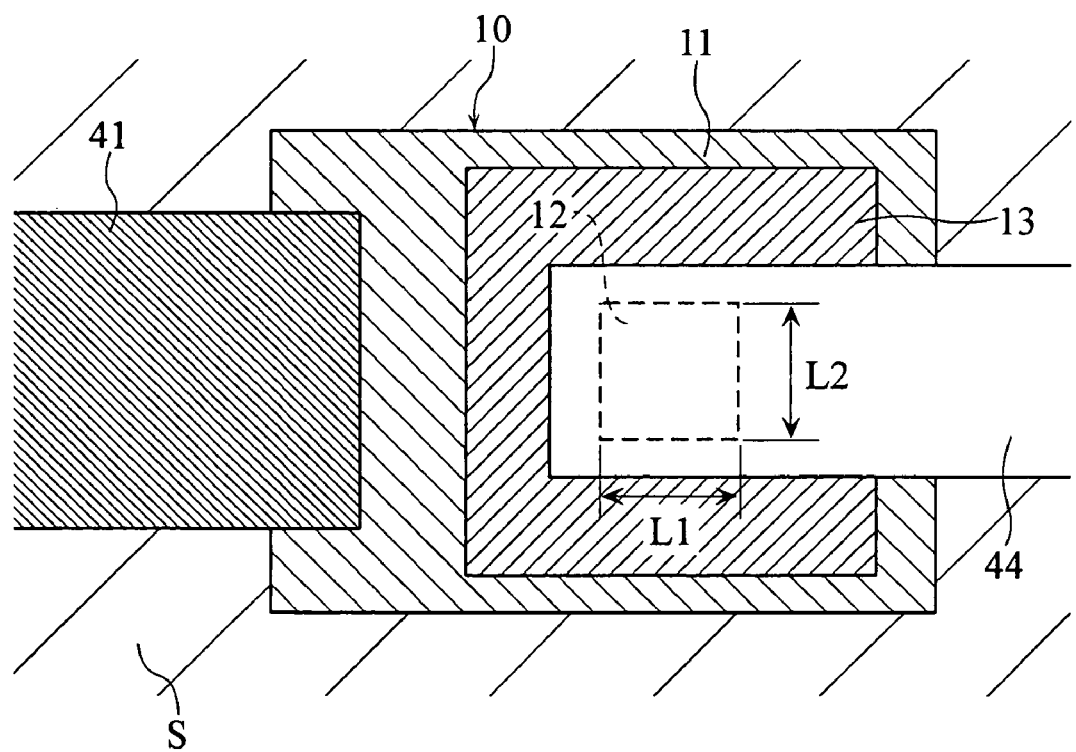
FIG. 17 is an enlarged fragmentary plan view showing the integrated electronic component shown in FIG. 13.

The fourth wiring portion 44 extends, as shown in FIG. 17 in addition to FIG. 14, along the substrate S and is connected to a portion of the electrode film 12 on the side of the second surface 12b, and to a part of the first wiring portion 41. FIG. 17 is an enlarged fragmentary plan view showing the capacitor 10 and a periphery thereof of the integrated electronic component X2, in which the protecting film 50 is not shown but the electrode film 12 is indicated by broken lines. The electrode film 12 of the capacitor 10 in the integrated electronic component X2 is, as shown in FIG. 13, electrically connected to the electrode pad 30D and the outer end portion 22 of the spiral coil 20B, via the fourth wiring portion 44, and the first wiring portion 41 connected to the fourth wiring portion 44. The electrical connections of the remaining portions of the integrated electronic component X2 are identical to those of the integrated electronic component X1.

FIGS. 18A to 20D illustrate a manufacturing method of the integrated electronic component X2. FIGS. 18A to 20D represent the progress of the formation process of the capacitor 10, a part of the spiral coil 20, the electrode pad 30 (corresponding to the electrode pads 30A to 30D), and a part of a wiring 40 shown in FIG. 20D, in cross-sectional views of a region including these constituents. The cross-sectional views progressively depict a model of a plurality of predetermined regions included in a single section where the integrated electronic component is formed, on a material substrate to be processed.

Figure 18A:
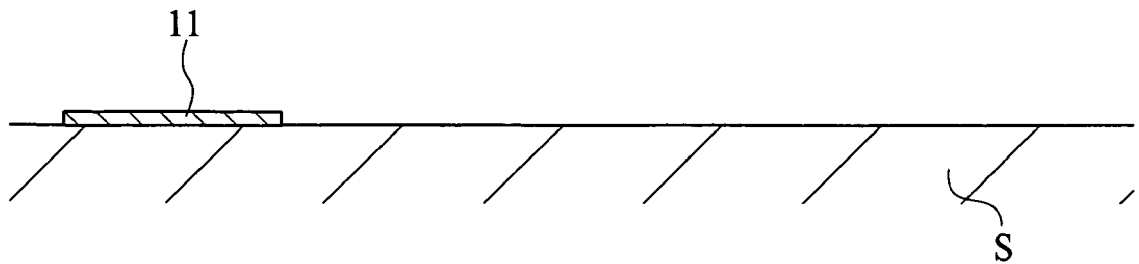
FIGS. 18A to 18D are cross-sectional views showing a manufacturing process of the integrated electronic component shown in FIG. 13.
Figure 18B:
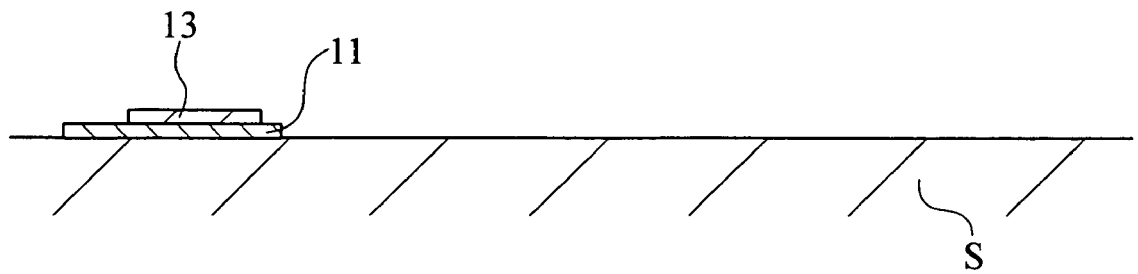
Figure 18C:
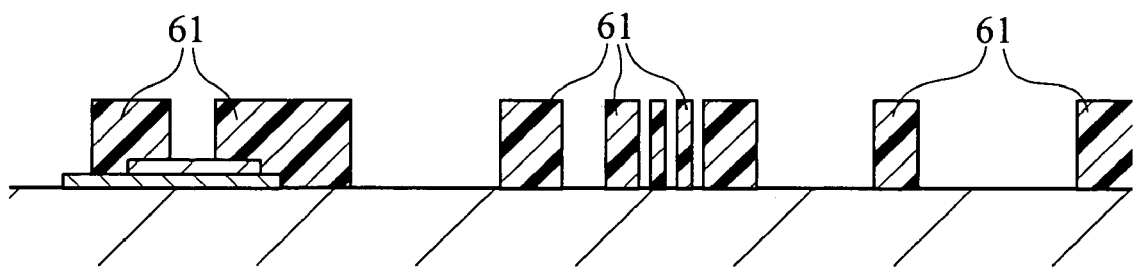
Figure 18D:
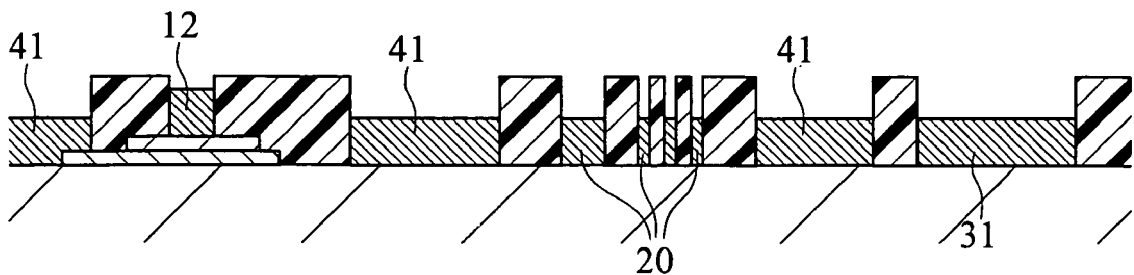
Figure 19A:
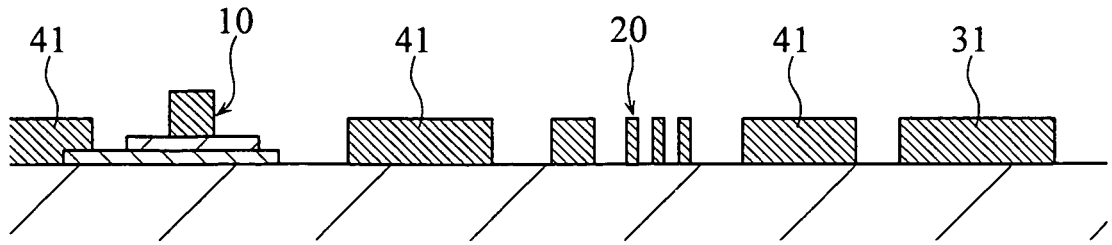
FIGS. 19A to 19D are cross-sectional views showing a manufacturing process subsequent to FIG. 18D.
Figure 19B:
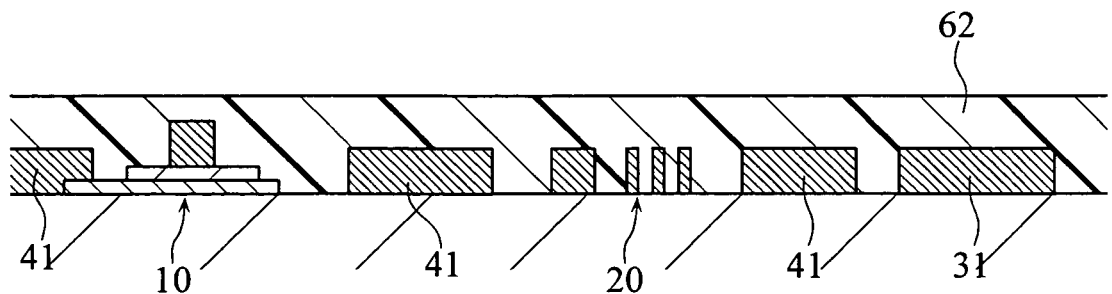

To form the integrated electronic component X2, referring first to FIG. 18A, the electrode film 11 of the capacitor 10 is formed on the substrate S. Then the dielectric film 13 is formed on the electrode film 11, as shown in FIG. 18B. A seed layer (not shown) for electroplating is then formed on the substrate S, so as to cover the electrode film 11 and the dielectric film 13, followed by formation of the resist pattern 61, as shown in FIG. 18C. Referring to FIG. 18D, an electroplating process is performed to form the electrode film 12, the spiral coil 20, the first portion 31, and the first wiring portion 41. Proceeding to FIG. 19A, the resist pattern 61 is removed, after which an exposed portion of the seed layer is removed. Then, as shown in FIG. 19B, the insulating film 62 is formed so as to cover the capacitor 10, the spiral coil 20, the first portion 31, and the first wiring portion 41. Specific details of the foregoing steps are similar to those described regarding the first embodiment, referring to FIGS. 8A to 8D and 9A to 9B.

Figure 19C:
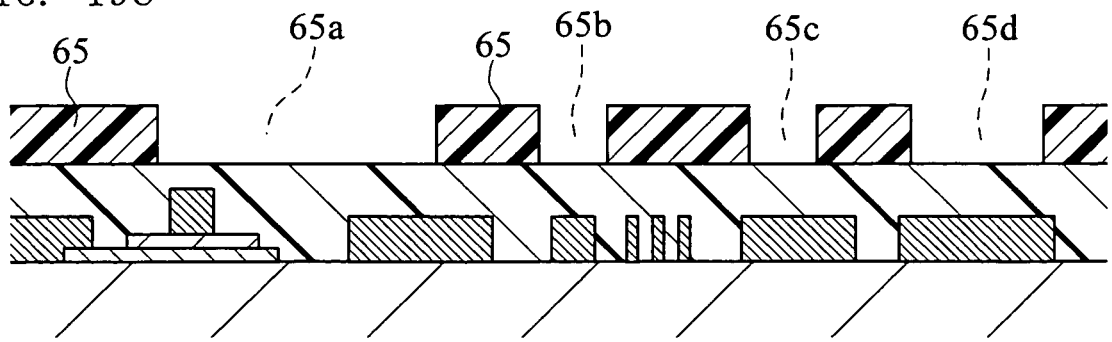

The manufacturing process of the integrated electronic component X2 now proceeds to FIG. 19C, in which a resist pattern 65 is formed on the insulating film 62. The resist pattern 65 is formed with an opening 65a corresponding to the pattern of the fourth wiring portion 44, openings 65b, 65c corresponding to the pattern of the vias 43B, 43C, and an opening 65d corresponding to the pattern of the second portion 32 of the electrode pad 30.

Figure 19D:
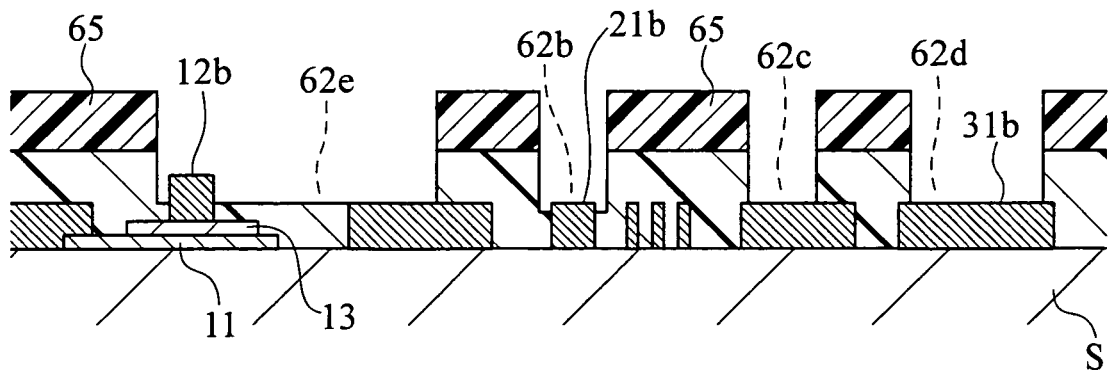

A wet etching process is then performed on the insulating film 62 utilizing the resist pattern 65 as the mask, as shown in FIG. 19D. As a result, the insulating film 62 becomes provided with an opening 62e for the fourth wiring portion 44 formed such that an entirety of the second surface 12b of the electrode film 12 is exposed, an opening 62b for the via 43B formed such that an entirety of the second surface 21b of the inner end portion 21 is exposed, an opening 62c for the via 43C formed such that at least a part of an upper surface of the first wiring portion 41 in the drawing is exposed, and an opening 62d for the second portion 32 formed such that a part of the second surface 31b of the first portion 31 is exposed. The opening 62e does not reach the dielectric film 13 and the electrode film 11. The opening 62b does not reach the substrate S.

Figure 20A:
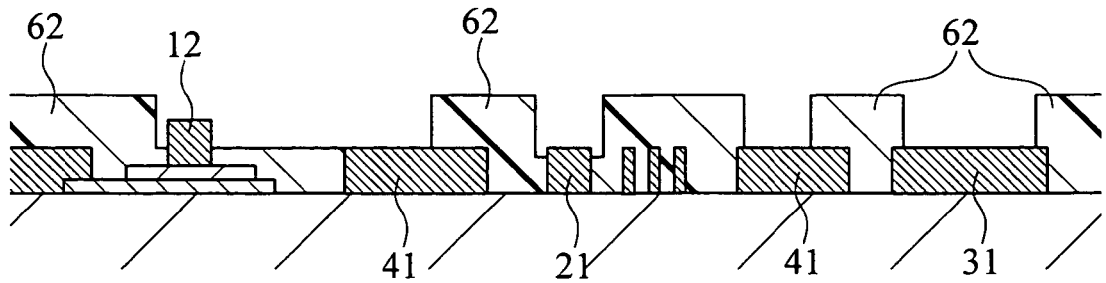
FIGS. 20A to 20D are cross-sectional views showing a manufacturing process subsequent to FIG. 19D.
Figure 20B:
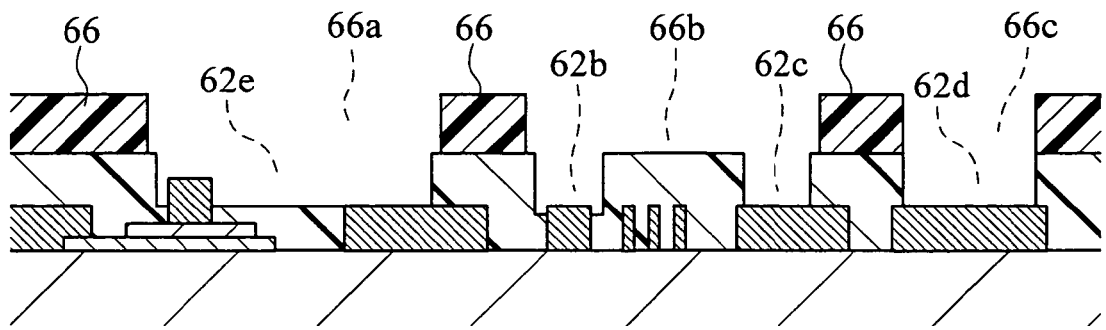

Proceeding to FIG. 20A, the resist pattern 65 is removed, after which a seed layer (not shown) for electroplating is formed over the surface of the insulating film 62, and exposed surfaces of the electrode film 12, the inner end portion 21, the first portion 31, and the first wiring portion 41. This is followed by formation of the resist pattern 66 on the insulating film 62, as shown in FIG. 20B. The resist pattern 66 is formed with an opening 66a corresponding to the pattern of the fourth wiring portion 44, an opening 66b corresponding to the pattern of the second wiring portion 42, and an opening 66c corresponding to the pattern of the second portion 32 of the electrode pad 30.

Figure 20C:
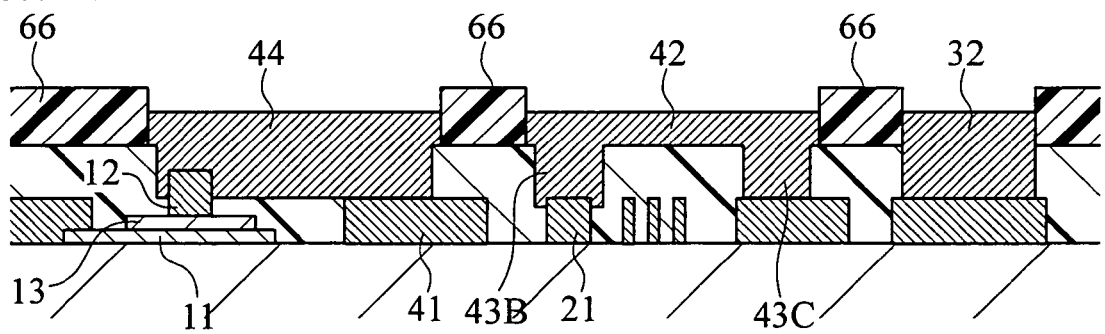

Then referring to FIG. 20C, an electroplating process is performed to deposit a predetermined metal material in the openings 62b to 62e of the insulating film 62 and in the openings 66a to 66c of the resist pattern 66, to thereby form the fourth wiring portion 44, the vias 43B, 43C, the second wiring portion 42, and the second portion 32. In this electroplating process, the seed layer is energized. The fourth wiring portion 44 does not reach the dielectric film 13 and the electrode film 11. The via 43B does not reach the substrate S.

Figure 20D:
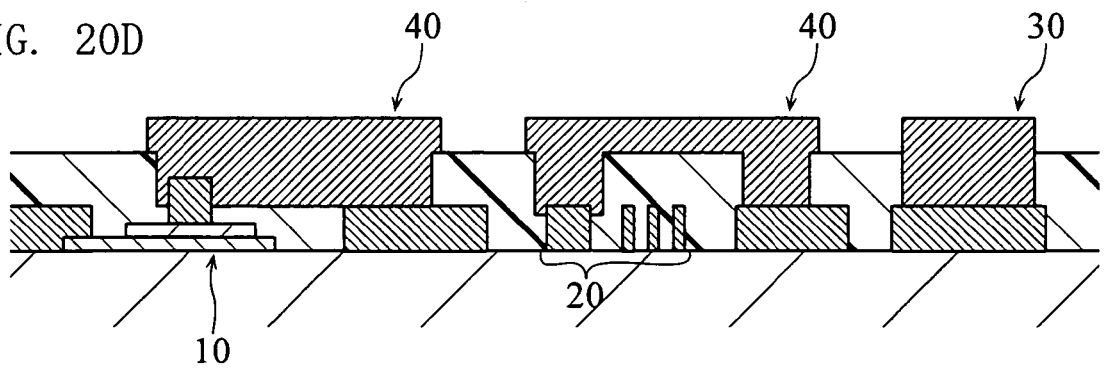
Figure 21:
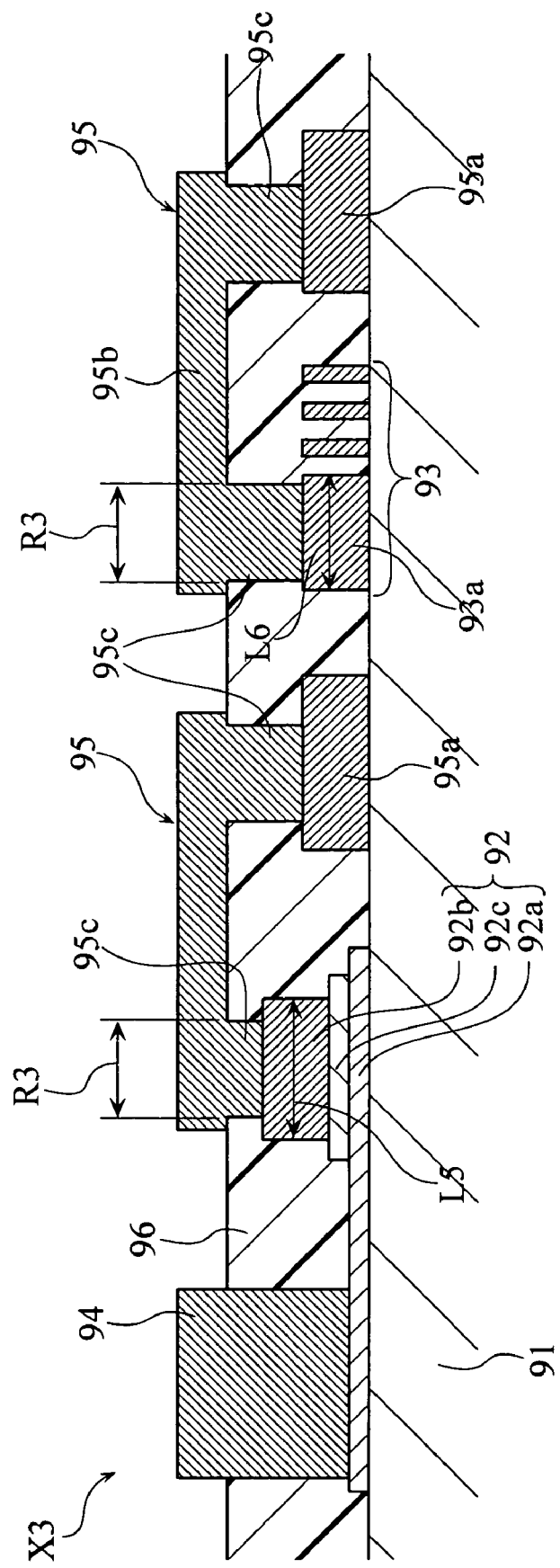
FIG. 21 is a fragmentary cross-sectional view showing an electronic component as related art for better understanding of the present invention.
Figure 22A:
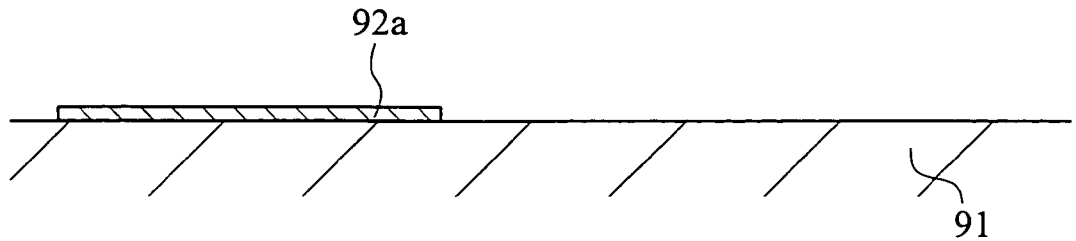
FIGS. 22A to 22D are cross-sectional views showing a manufacturing process of the integrated electronic component shown in FIG. 21.
Figure 22B:
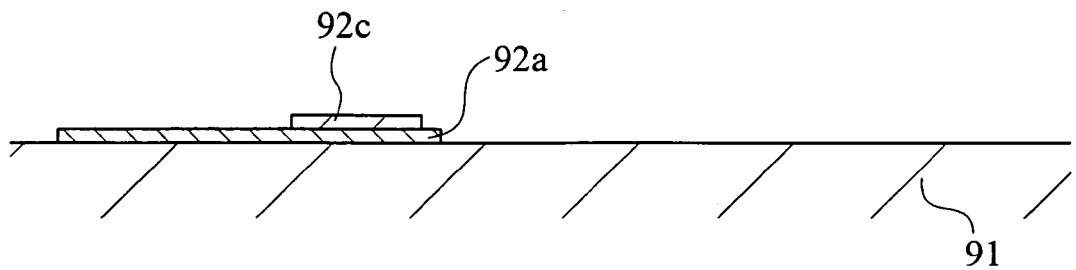
Figure 22C:
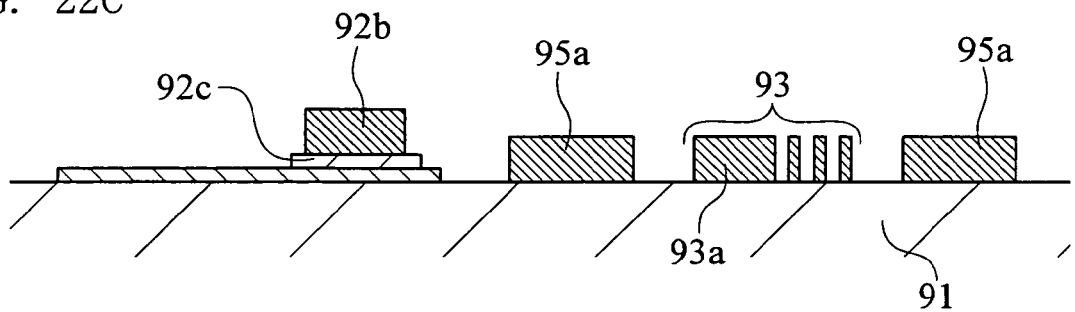
Figure 22D:
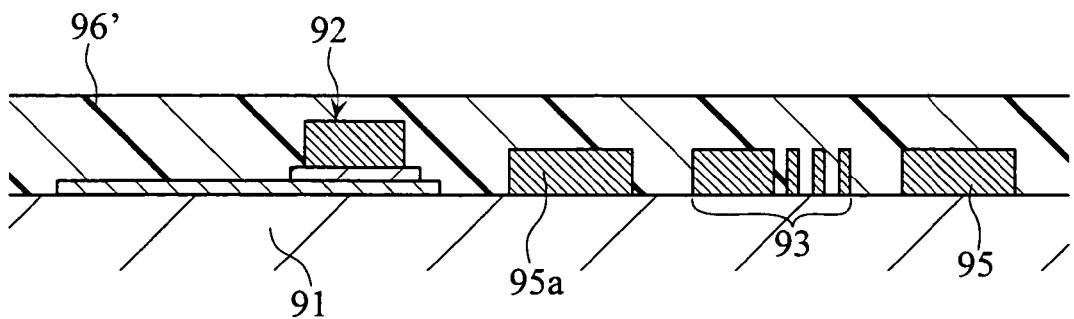
Figure 23A:
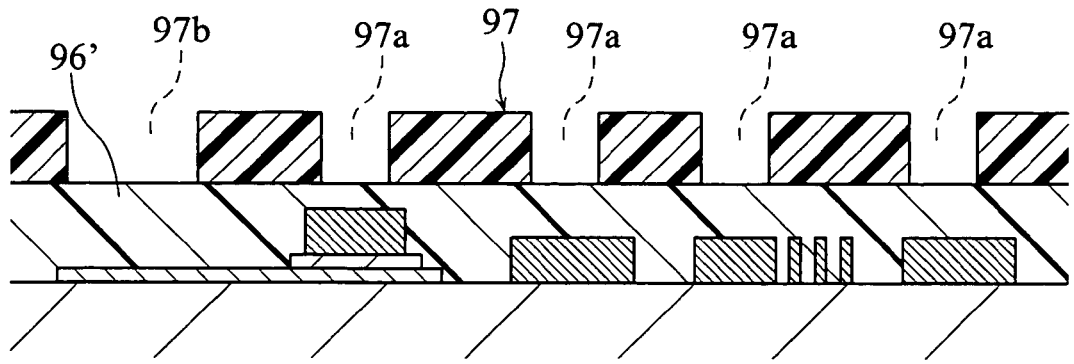
FIGS. 23A to 23D are cross-sectional views showing a manufacturing process subsequent to FIG. 22D.
Figure 23B:
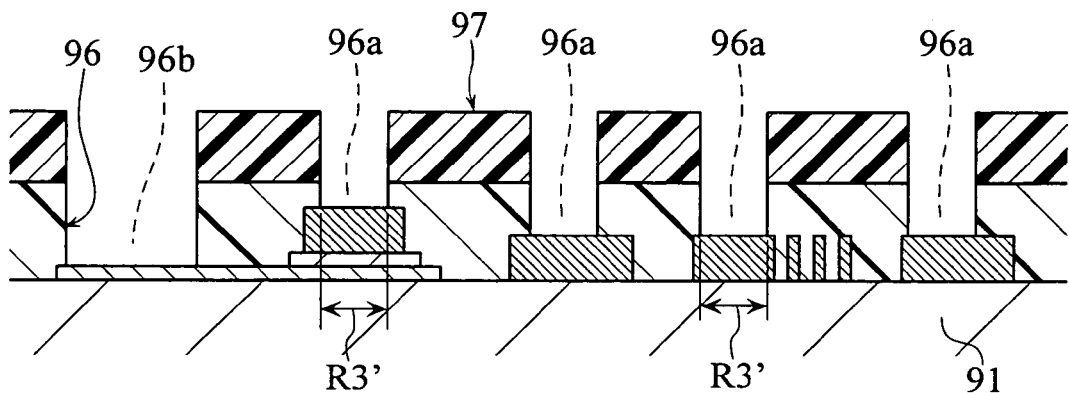
Figure 23C:
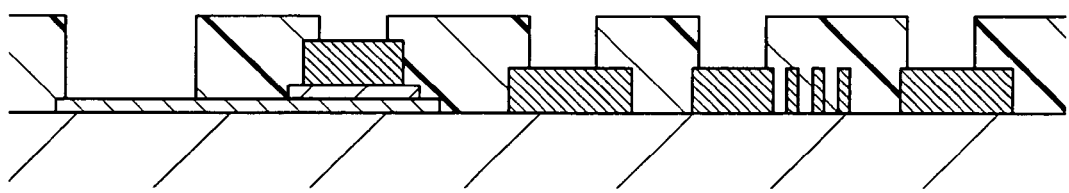
Figure 23D:
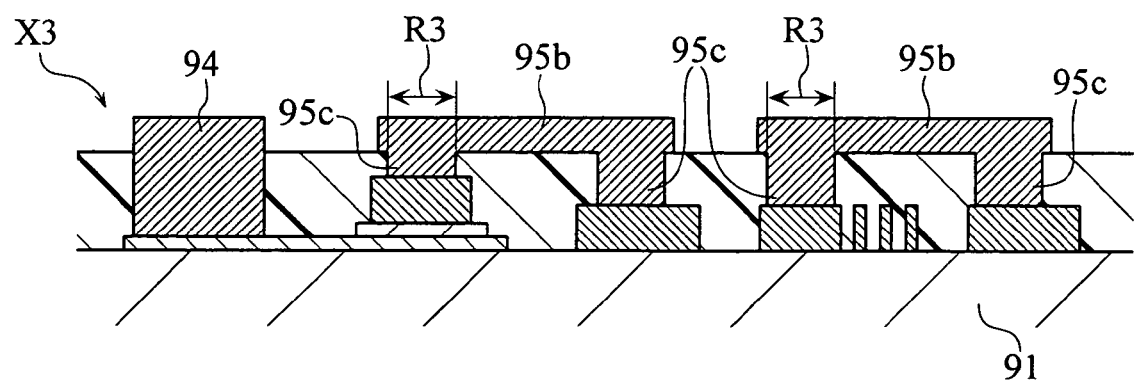
Figure 24A:
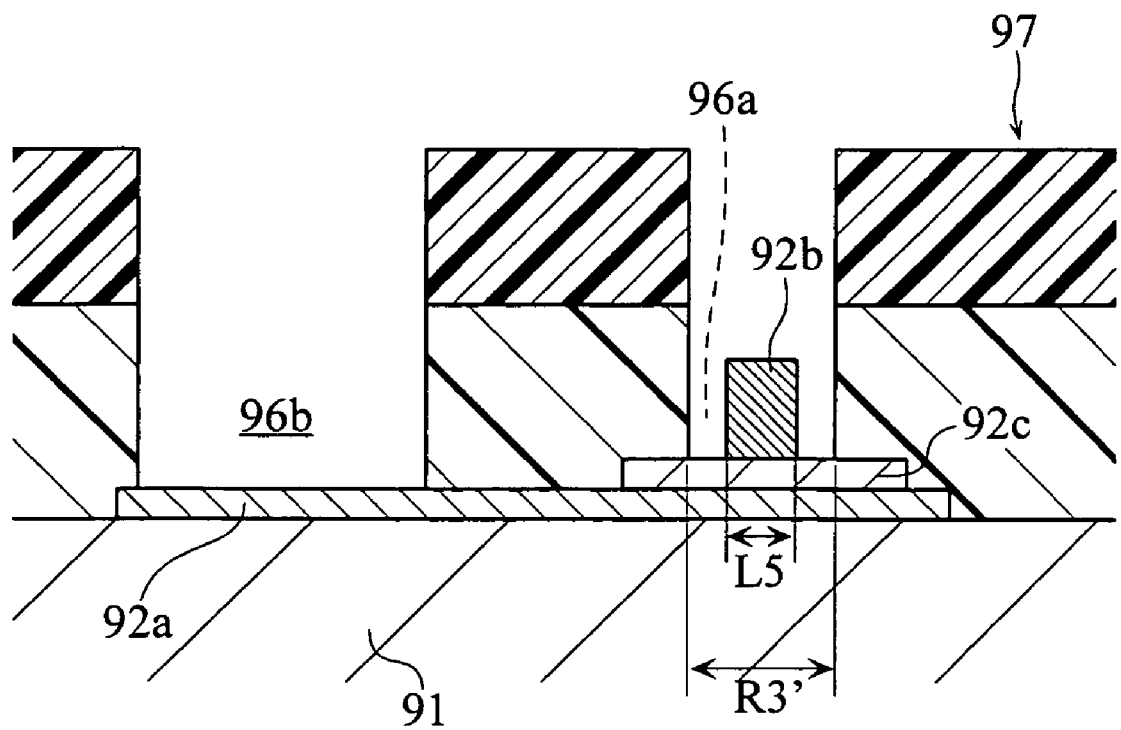
FIGS. 24A and 24B are cross-sectional views showing an imaginary step in the manufacturing process of the integrated electronic component according to the related art.
Figure 24B:
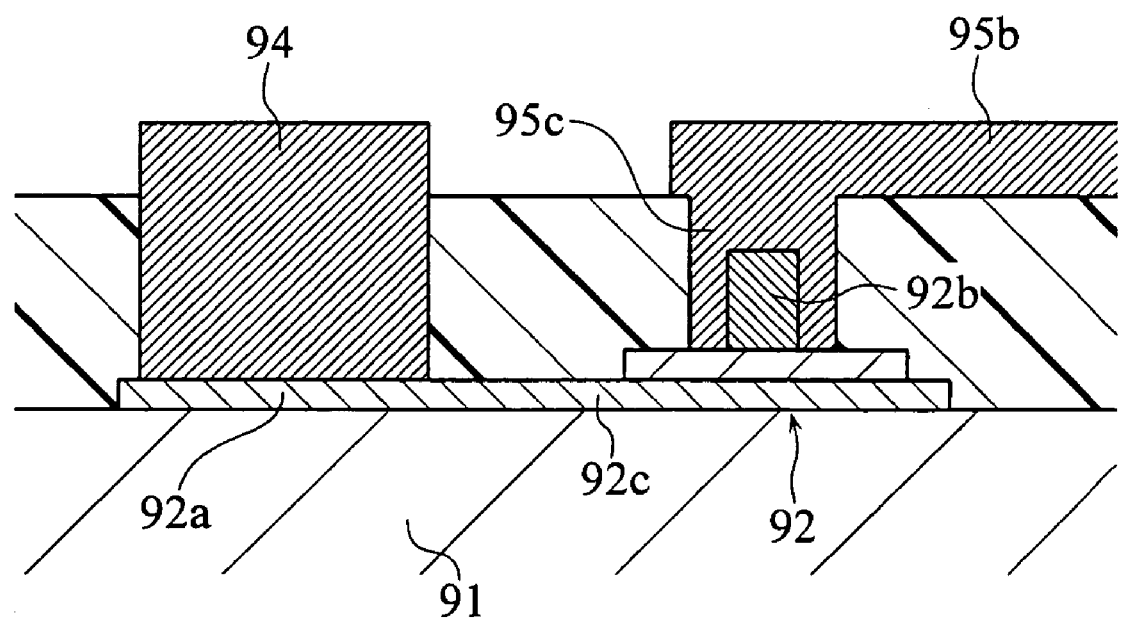
Figure 25A:
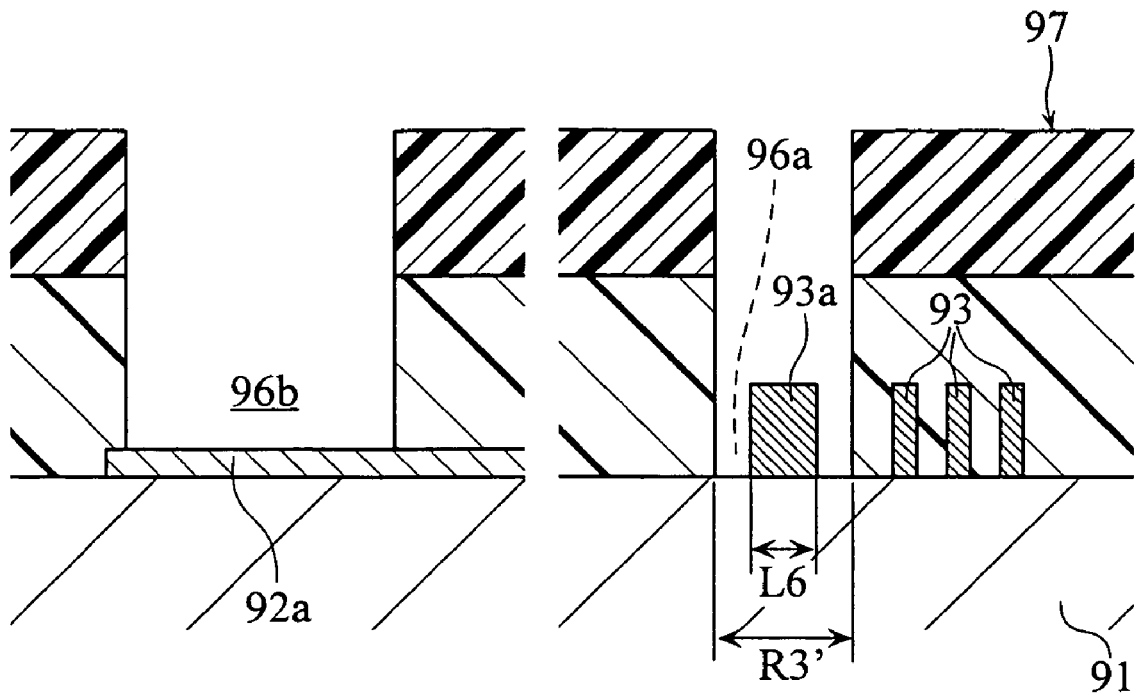
FIGS. 25A and 25B are cross-sectional views showing another imaginary step in the manufacturing process of the integrated electronic component according to the related art.
Figure 25B:
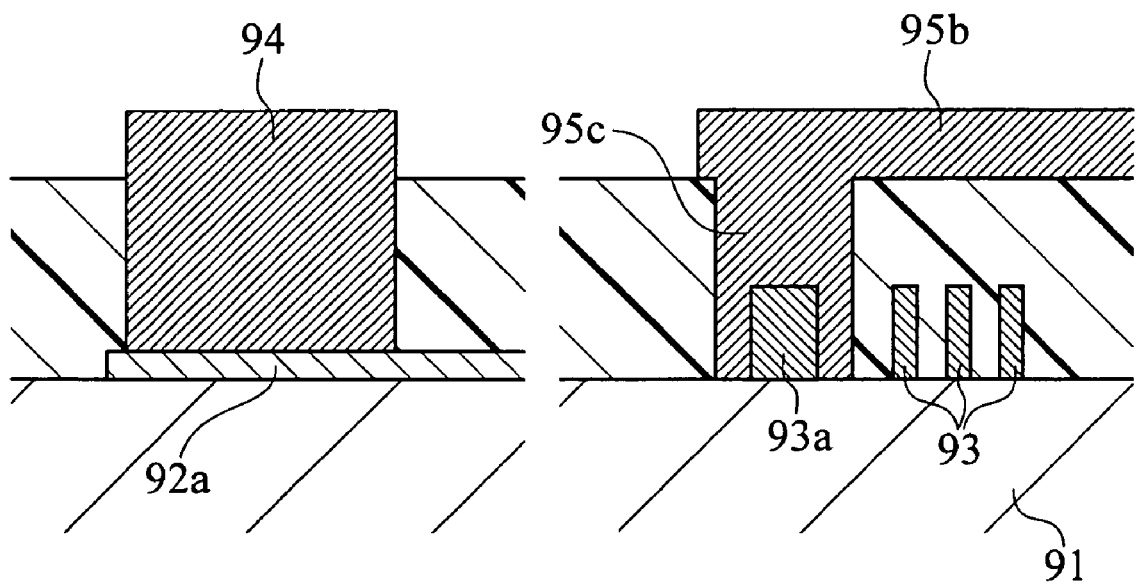

Then the resist pattern 66 is removed, as shown in FIG. 20D. This is followed by removal of an exposed portion of the seed layer. Throughout the foregoing process, the integrated electronic component X2 shown in FIG. 13 can be manufactured.

The process described referring to FIG. 19D allows stopping the etching process when at least a part of the second surface 31b of the first portion 31, which is to constitute a part of the electrode pad 30, as well as an entirety of the second surface 12b of the electrode film 12 of the capacitor 10 and an entirety of the second surface 21b of the inner end portion 21 of the spiral coil 20 are properly exposed, thereby preventing the opening 62e from reaching the dielectric film 13 and the electrode film 11, and the opening 62b from reaching the base material, as stated earlier. Accordingly, in the process described referring to FIG. 20C, the fourth wiring portion 44 can be formed so as not to reach the dielectric film 13 and the electrode film 11, and the via 43B so as not to reach the substrate S. In the integrated electronic component X2, therefore, higher degree of freedom is granted for designing the two-dimensional size of the electrode film 12 of the capacitor 10 in a small size, free from the restriction by the shape of the fourth wiring portion 44 to be connected to the electrode film 12, and for designing the two-dimensional size of the inner end portion 21 of the spiral coil 20 in a small size, free from the restriction by the two-dimensional size or the diameter R2 (shown in FIG. 15) of the via 43B to be connected to the inner end portion 21. The integrated electronic component X2 thus structured facilitates reducing the static capacitance of the capacitor 10 and achieving a high Q value required from the spiral coils 20A, 20B, while satisfying the requirement for reduction in dimensions of the electronic component.

In the integrated electronic components X1, X2, a so-called conformal insulating film, which covers the structure on the substrate S except a part of the surface of the respective electrode pads 30A to 30D, may be provided in place of the protecting film 50. To form such conformal insulating film in the integrated electronic components X1, X2, firstly the protecting film 50 is removed by a dry or wet etching process. Then for example a CVD process is performed to form a thin insulating film so as to cover the structure on the substrate S. The insulating film is then patterned so as to expose a part of the surfaces of the electrode pads 30A to 30D. Employing the conformal insulating film is advantageous in reducing parasitic capacitance that may emerge between the wirings.

The invention claimed is:

1. An electronic component comprising:
   a base material;
   a capacitor including a first electrode provided on the base material, a second electrode including a first electrode-surface facing the first electrode and a second electrode-surface opposite to the first electrode-surface, and a dielectric film interposed between the first electrode and the second electrode;
   a protecting film provided on the capacitor; and
   a wiring including a wiring portion provided on the protecting film and a via portion extending from the wiring portion toward the capacitor, the via portion including a first via-surface joined to the second electrode-surface of the second electrode and a second via-surface interposing the protecting film between the second via-surface and the dielectric film, the first via-surface and the second via-surface being formed on a side of the via portion facing the capacitor.

2. The electronic component according to claim 1, wherein a diameter of the via portion is larger than a diameter of the second electrode.

3. An electronic component comprising:
   a base material;
   a capacitor including a first electrode provided on the base material, a second electrode including a first electrode-surface facing the first electrode and a second electrode-surface opposite to the first electrode-surface, and a dielectric film interposed between the first electrode and the second electrode; and
   a wiring including an elongate portion extending along the base material, the elongate portion being directly joined to the second electrode-surface of the second electrode.

4. The electronic component according to any one of claims 1 and 3, further comprising a passive component provided on the base material; wherein the wiring constitutes at least part of an electrical path between the passive component and the capacitor.

5. The electronic component according to any one of claims 1 and 3, further comprising an electrode pad provided on the base material; wherein the wiring constitutes at least part of an electrical path between the electrode pad and the capacitor.

6. An electronic component comprising:
   a base material;
   a spiral coil including a first coil-surface on the base material side and a second coil-surface opposite to the first coil-surface, the spiral coil being provided on the base material;
   a protecting film provided on the spiral coil; and
   a wiring including both an elongate portion extending along the base material and a via portion extending from the elongate portion toward the spiral coil, the via portion including a first via-surface joined to the second coil-surface and a second via-surface interposing the protecting film between the second via-surface and the base material.

7. The electronic component according to claim 6, further comprising a passive component provided on the base material; wherein the wiring constitutes at least part of an electrical path between the passive component and the spiral coil.

8. The electronic component according to claim 6, further comprising an electrode pad provided on the base material; wherein the wiring constitutes at least part of an electrical path between the electrode pad and the spiral coil.

* * * * *